United States Patent
Kurokawa

(10) Patent No.: US 9,349,722 B2
(45) Date of Patent: May 24, 2016

(54) SEMICONDUCTOR MEMORY DEVICE INCLUDING A MEMORY CELL COMPRISING A D/A CONVERTER

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 421 days.

(21) Appl. No.: 13/803,137

(22) Filed: Mar. 14, 2013

(65) Prior Publication Data

US 2013/0258746 A1  Oct. 3, 2013

(30) Foreign Application Priority Data

Mar. 29, 2012 (JP) ................ 2012-076671
Apr. 24, 2012 (JP) ................ 2012-098813

(51) Int. Cl.

| | | |
|---|---|---|
| *G11C 5/06* | (2006.01) | |
| *H01L 27/06* | (2006.01) | |
| *H01L 27/115* | (2006.01) | |
| *H01L 27/12* | (2006.01) | |
| *G11C 7/16* | (2006.01) | |

(Continued)

(52) U.S. Cl.
CPC ............. *H01L 27/0688* (2013.01); *G11C 5/06* (2013.01); *G11C 7/16* (2013.01); *G11C 11/24* (2013.01); *G11C 11/5685* (2013.01); *G11C 13/0007* (2013.01); *H01L 27/115* (2013.01); *H01L 27/1225* (2013.01); *G11C 5/063* (2013.01); *G11C 2211/4016* (2013.01); *G11C 2213/53* (2013.01); *G11C 2213/71* (2013.01); *G11C 2213/74* (2013.01)

(58) Field of Classification Search
None
See application file for complete search history.

(56) References Cited

U.S. PATENT DOCUMENTS 4,466,081 A   8/1984   Masuoka
5,570,315 A   10/1996   Tanaka et al.
(Continued)

FOREIGN PATENT DOCUMENTS

EP   0 053 878 A2   6/1982
EP   1 737 044 A1   12/2006
(Continued)

OTHER PUBLICATIONS

Shoji Shukuri et al.; "A Semi-Static Complementary Gain Cell Technology for Sub-1 V Supply DRAM's"; IEEE Transactions on Electron Devices; Jun. 1, 1994, vol. 41, No. 6, pp. 926-931.
(Continued)

*Primary Examiner* — Kretelia Graham
(74) *Attorney, Agent, or Firm* — Fish & Richardson P.C.

(57) ABSTRACT

A nonvolatile semiconductor device is provided. Each memory cell in a semiconductor device includes a D/A converter and an amplifier transistor. An output voltage of the D/A converter is stored as data in the memory cell, whereby two or more bits of data can be stored in the memory cell. By stacking transistors of the D/A converter with an interlayer film provided therebetween and using the parasitic resistance of a conductive material provided in a contact hole formed in the interlayer film as a resistor of the D/A converter, the area of the memory cell can be reduced. The transistor includes an oxide semiconductor in a channel formation region. Accordingly, a nonvolatile semiconductor device can be easily obtained.

19 Claims, 11 Drawing Sheets

(51) Int. Cl.
*G11C 11/24* (2006.01)
*G11C 11/56* (2006.01)
*G11C 13/00* (2006.01)

(56) References Cited

U.S. PATENT DOCUMENTS

| | | | |
|---|---|---|---|
| 5,652,719 A | 7/1997 | Tanaka et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,229,467 B1 * | 5/2001 | Eklund et al. | 341/120 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0125017 A1 * | 6/2006 | Liu | 257/365 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 * | 10/2006 | Kimura | 315/169.3 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0225615 A1 * | 9/2010 | Kurokawa | 345/175 |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-093979 A | 4/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc—Oxide Thin Film Transistors for Three-Dimensional Stacking Memory"; IEEE Electron Device Letters; Jun. 1, 2008; pp. 549-552; vol. 29, No. 6.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

(56) References Cited

OTHER PUBLICATIONS

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

Asakuma, N et al., "Crystallization and Reduction of Sol—Gel—Derived Zinc Oxide Films by Irradiation With Ultraviolet Lamp," Journal of Sol—Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

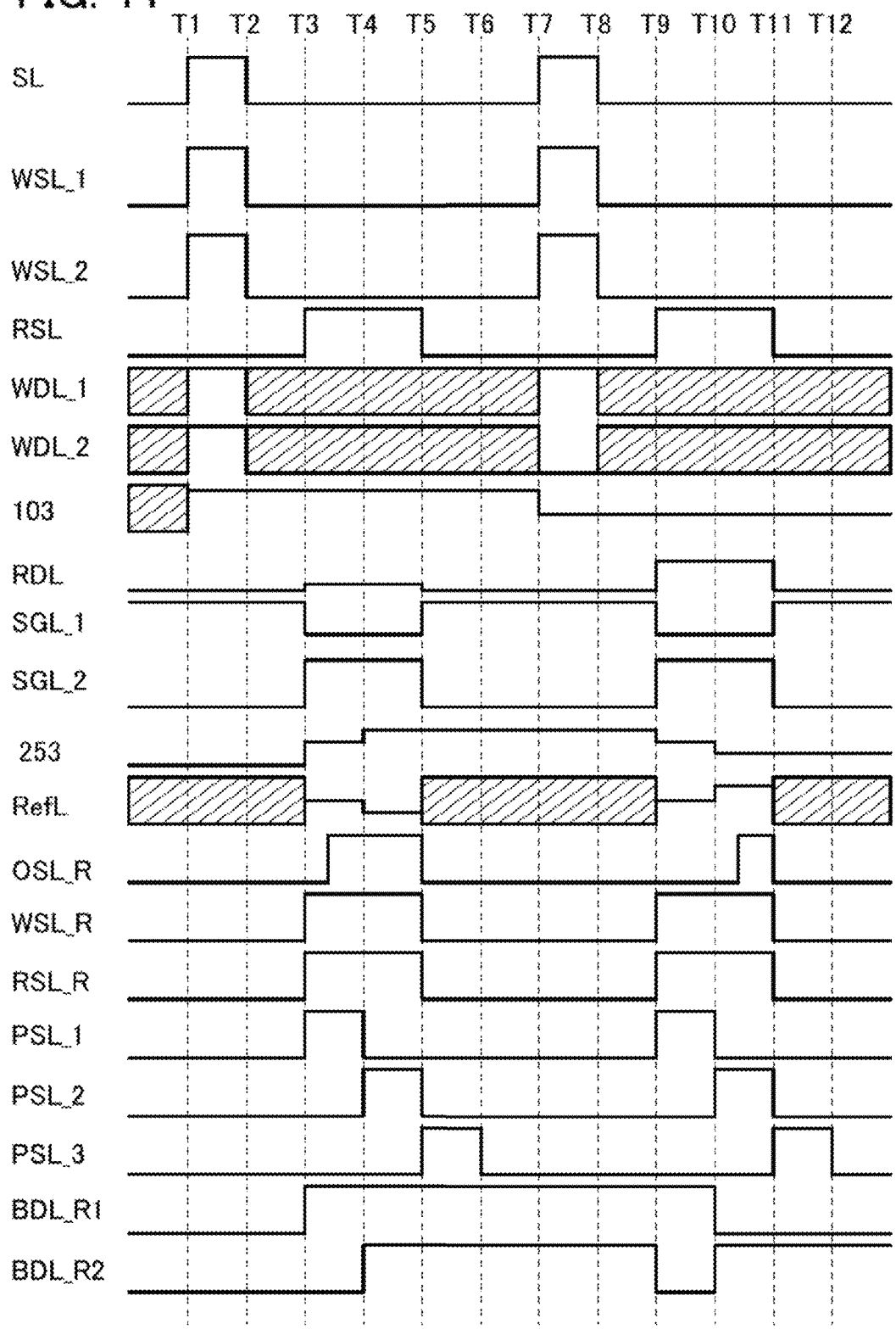

SEMICONDUCTOR MEMORY DEVICE INCLUDING A MEMORY CELL COMPRISING A D/A CONVERTER

BACKGROUND OF THE INVENTION

1. Field of the Invention

The present invention relates to a semiconductor device.

2. Description of the Related Art

Flash memories have become widespread as semiconductor devices having nonvolatile memory functions. A flash memory includes a floating gate between a gate electrode and a channel formation region of a transistor included in a memory element and stores data by holding charge in the floating gate (e.g., Patent Document 1).

In a flash memory, the multi-level technique by which plural bits of data can be stored in one memory cell has been in practical use (e.g., Patent Document 2). By the multi-level technique, the area of the memory cell per bit can be reduced.

However, in a flash memory, a gate insulating layer between a floating gate and a channel formation region of a transistor included in a memory element deteriorates because of tunneling current generated in writing. This results in a problem in that the data retention characteristics of the memory element are degraded after a predetermined number of writing operations. To reduce adverse effects of this problem, a method in which the number of writing operations of memory elements is equalized is employed, for example. However, a complicated peripheral circuit is needed to employ this method. Moreover, even when such a method is employed, the fundamental problem of lifetime cannot be resolved. In other words, a flash memory is not suitable for applications in which data is frequently rewritten.

In addition, in the flash memory, a high voltage is necessary for holding of charge in the floating gate or removal of the charge and a step-up circuit for generating a high voltage is also necessary.

REFERENCE

Patent Document

[Patent Document 1] Japanese Published Patent Application No. S57-105889
[Patent Document 2] Japanese Published Patent Application No. H07-093979

SUMMARY OF THE INVENTION

In view of the above, an object of one embodiment of the present invention is to provide a semiconductor device which has no limit on the number of writing operations. Another object is to provide a semiconductor device in which the area of a memory cell per bit can be reduced. In addition, another object is to provide a nonvolatile semiconductor device.

To achieve the above object, one embodiment of the present invention a structure is employed in which each memory cell in a semiconductor device includes a D/A converter and an amplifier transistor.

The D/A converter can output a voltage corresponding to two or more bits of input data. For example, the D/A converter can output a four-level voltage which corresponds to two-bit data.

Thus, an output voltage of the D/A converter is stored in the memory cell as data, whereby plural bits of data can be stored in the memory cell. A wiring through which the output voltage of the D/A converter is supplied is electrically connected to a gate electrode of the amplifier transistor. The resistance between a source and a drain of the amplifier transistor varies depending on a voltage of the gate electrode, and data in the memory cell can be read by detecting an output signal corresponding to the resistance between the source and the drain with a read circuit.

The output voltage of the D/A converter is stored in the memory cell as data as described above, so that a high-performance write circuit is not necessary for writing data. For example, a voltage of about 20 V is necessary for injection of electrons into or extraction of electrons from a floating gate in a flash memory; however, such a high voltage is unnecessary in one embodiment of the present invention. Thus, a step-up circuit for a write voltage is not needed, which enables simplification of a write circuit. Further, a problem of deterioration of a gate insulating layer due to injection or extraction of electrons does not occur. Thus, a semiconductor device with improved reliability which has no limit on the number of writing operations can be obtained.

The D/A converter only outputs a voltage corresponding to plural bits of data to supply the voltage which is to be stored in the memory cell as data to the amplifier transistor as a potential of the gate electrode; thus, the drive capability of the D/A converter in the memory cell may be low. Accordingly, a peripheral circuit in the above structure can be simple compared with a peripheral circuit in a structure in which the peripheral circuit is located outside a memory cell and includes a D/A converter outputting a voltage corresponding to stored data.

Further, since data is written by the operation of the D/A converter, high-speed writing can be easily performed. To change data stored in the memory cell, a potential corresponding to new data is output from the D/A converter to be supplied as a potential of the gate electrode of the amplifier transistor. Thus, there is an advantage over a flash memory of not needing an operation for erasing data before data writing.

The D/A converter includes a plurality of transistors and a plurality of resistors. The plurality of transistors included in the D/A converter are stacked, whereby the area of the memory cell can be reduced. All transistors needed for one D/A converter can be stacked, for example. Thus, the area of the memory cell per bit can be reduced. As transistors which can be stacked, thin film transistors can be used.

The parasitic resistance of a wiring which is electrically connected to the transistor can be used as the resistor of the D/A converter. Transistors can be stacked alternately with interlayer films and the parasitic resistance of a conductive material provided in a contact hole formed in the interlayer film can be used as the resistor, for example. Thus, the area of the resistor can be reduced and the area of the memory cell per bit can be reduced.

In one embodiment of the present invention, a semiconductor device which has no limit on the number of writing operations can be provided. Further, a semiconductor device in which the area of a memory cell per bit can be reduced can be provided. In addition, a nonvolatile semiconductor device can be provided.

BRIEF DESCRIPTION OF THE DRAWINGS

FIG. 11 illustrates a semiconductor device of one embodiment of the present invention.

DETAILED DESCRIPTION OF THE INVENTION

Figure 1A:
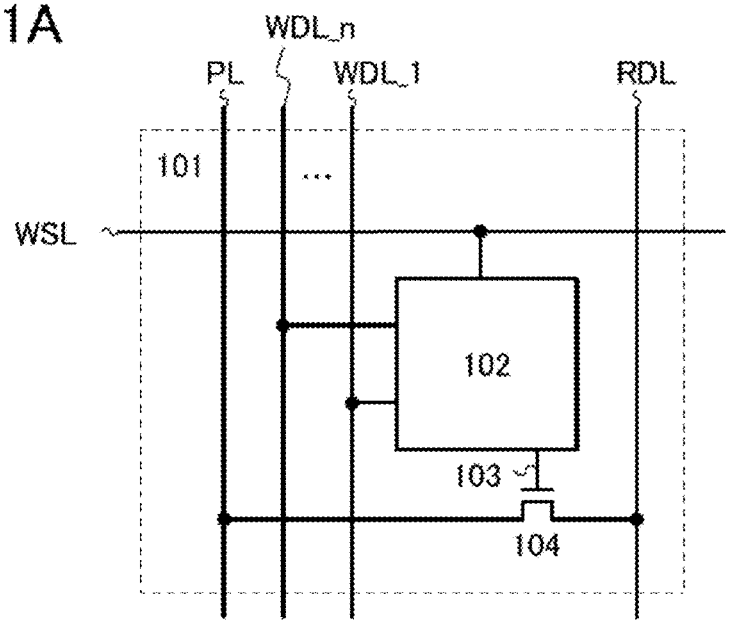
FIGS. 1A and 1B each illustrate a semiconductor device of one embodiment of the present invention.

Hereinafter, embodiments of the invention disclosed in this specification will be described with reference to the accompanying drawings. Note that the invention disclosed in this specification is not limited to the following description, and it is easily understood by those skilled in the art that embodiments and details can be variously changed without departing from the spirit and the scope of the invention. Thus, the invention disclosed in this specification is not construed as being limited to the description of the following embodiments. Note that the ordinal numbers such as "first" and "second" in this specification are used for convenience and do not denote the order of steps or the stacking order of layers. In addition, the ordinal numbers do not denote particular names which specify the invention.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" (or "source electrode") and a "drain" (or "drain electrode") are sometimes replaced with each other when a transistor of opposite polarity is used or when the direction of current flowing is changed in circuit operation, for example. Thus, the terms "source" and "drain" can be replaced with each other in this specification and the like. Further, in this specification and the like, a channel formation region is a region between a source region (or a source electrode) and a drain region (or a drain electrode).

In the following description, a p-channel transistor is specified, and a transistor which is not particularly specified is regarded as an n-channel transistor. Note that a conductivity type of a transistor, a potential (high/low) of a signal supplied to each electrode, and the like can be decided as appropriate. For example, a circuit may be formed in a manner such that the conductivity types of channels of some transistors are exchanged and a signal in which the level of a potential is inverted is input to a gate of the transistor whose channel has an exchanged conductivity type. Further, an inverter or the like may be provided as appropriate to generate a signal in which the level of a potential is inverted.

Note that in this specification and the like, the term "electrically connected" includes the case where components are connected through an "object having any electric function". There is no particular limitation on the "object having any electric function" as long as electric signals can be transmitted and received between components that are connected through the object.

Embodiment 1

In this embodiment, a semiconductor device of one embodiment of the present invention will be described with reference to FIGS. 1A and 1B, FIGS. 2A and 2B, FIG. 9, FIGS. 10A and 10B, and FIG. 11.

<Example of Memory Cell>

First, a structure of the semiconductor device is described. FIG. 1A illustrates a memory cell 101, which is an example of the semiconductor device.

The memory cell 101 in FIG. 1A is electrically connected to a write selection line WSL, n write data lines WDL_1 to WDL_n, a power line PL, and a read data line RDL. Here, n is a natural number of two or more. Note that n-bit first digital data is input to the memory cell 101. At this time, each bit of data of the n-bit first digital data is input to the memory cell 101 through a corresponding write data line (any one of the write data lines WDL_1 to WDL_n). The memory cell 101 has functions of converting the n-bit first digital data into a first analog data and storing the converted data.

The memory cell 101 in FIG. 1A includes a D/A converter 102 and an amplifier transistor 104. The D/A converter 102 is electrically connected to a gate electrode of the amplifier transistor 104 through a node 103. In that case, a potential of the gate electrode of the amplifier transistor is changed depending on the first analog data that is generated by the D/A converter 102.

The D/A converter 102 includes a plurality of transistors. The plurality of transistors may be stacked, so that the area of the memory cell per bit can be reduced. As the transistors which can be stacked, thin film transistors can be given, for example. The D/A converter 102 has a function of, for example, converting the n-bit first digital data into the first analog data. An R-2R ladder D/A converter or the like can be used as the D/A converter 102.

The D/A converter 102 is electrically connected to the write selection line WSL and the n write data lines WDL_1 to WDL_n. A voltage corresponding to one-bit data can be input from each write data line WDL.

The D/A converter 102 can output a voltage corresponding to n-bit data input from the n write data lines WDL_1 to WDL_n to the node 103.

A source electrode and a drain electrode of the amplifier transistor 104 are electrically connected to the power line PL and the read data line RDL, respectively. The resistance between the source and the drain of the amplifier transistor varies depending on a voltage of the node 103 to which the gate electrode of the amplifier transistor 104 is electrically connected. Accordingly, data in the memory cell 101 can be read by detecting an output signal corresponding to the resistance between the source and the drain of the amplifier transistor 104 with a read circuit.

With the above structure, n-bit data can be stored in the memory cell 101.

The output voltage of the D/A converter 102 is stored in the memory cell 101 as data as described above, so that a high-performance write circuit is not necessary for writing data. For example, a voltage of about 20 V is necessary for injection of electrons into or extraction of electrons from a floating gate in a flash memory; however, such a high voltage is unnecessary in one embodiment of the present invention. Thus, a step-up circuit for a write voltage is not needed, which enables simplification of a write circuit. Further, a problem of deterioration of a gate insulating layer due to injection or extraction of electrons does not occur. Thus, a semiconductor device with improved reliability which has no limit on the number of writing operations can be obtained.

The D/A converter 102 only outputs a voltage corresponding to plural bits of data to supply the voltage which is to be stored in the memory cell 101 as data to the amplifier transistor 104 as a potential of the gate electrode; thus, the drive capability of the D/A converter 102 may be low. Accordingly, a peripheral circuit in the above structure can be simple compared with a peripheral circuit in a structure in which the peripheral circuit is located outside a memory cell and includes a D/A converter outputting a voltage corresponding to stored data.

Further, since data is written by the operation of the D/A converter 102, high-speed writing can be easily performed. To change data stored in the memory cell 101, a potential corresponding to new data is output from the D/A converter 102 to be supplied as a potential of the gate electrode of the amplifier transistor 104. Thus, there is an advantage over a flash memory of not needing an operation for erasing data before data writing.

With such a memory cell 101 which can store plural bits of data, the area of the memory cell per bit of stored data can be reduced. Thus, a highly integrated semiconductor device can be provided. Since a chip cost per bit can be reduced, a semiconductor device manufactured at low cost can be provided.

<Another Example of Memory Cell>

Figure 1B:
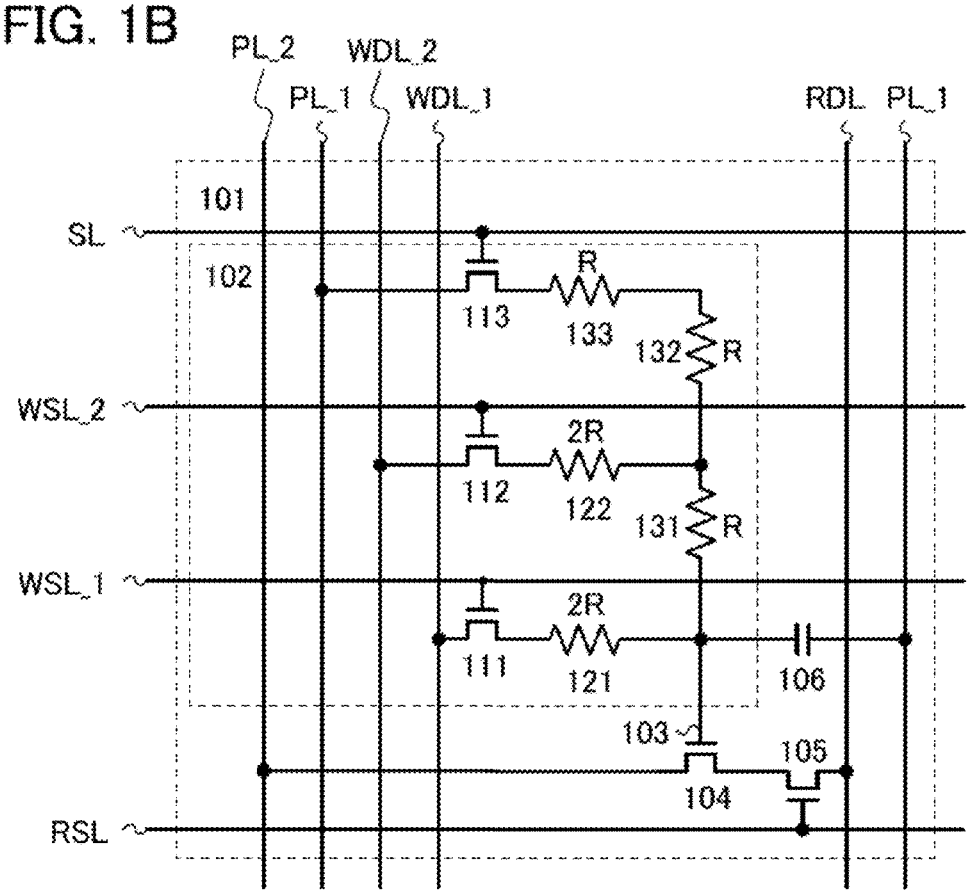

Next, the memory cell 101, which is an example of the semiconductor device of one embodiment of the present invention, having different structure is illustrated in FIG. 1B. The memory cell 101 in FIG. 1B includes the R-2R ladder D/A converter 102 as a D/A converter. The memory cell 101 in FIG. 1B can store two-bit data.

<Structure>

First, the structure of the memory cell 101 in FIG. 1B will be described below.

The memory cell 101 is electrically connected to a selection line SL, a first write selection line WSL_1, a second write selection line WSL_2, a first power line PL_1, a second power line PL_2, the first write data line WDL_1, the second write data line WDL_2, a read selection line RSL, and the read data line RDL.

The memory cell 101 includes the D/A converter 102, the amplifier transistor 104, a selection transistor 105, and a capacitor 106.

Further, the D/A converter 102 includes a transistor 111, a transistor 112, a transistor 113, a resistor 121, a resistor 122, a resistor 131, a resistor 132, and a resistor 133. That is, the memory cell 101 includes a plurality of transistors each of which is provided for one bit of the n-bit first digital data and controls writing of one-bit data. Note that the plurality of transistors may be stacked, so that the area of the memory cell per bit can be reduced.

The resistance values of the resistor 121 and the resistor 122 are equal. Further, the resistance values of the resistor 131, the resistor 132, and the resistor 133 are equal. Furthermore, the resistance values of the resistor 121 and the resistor 122 are each twice as large as each of the resistance values of the resistor 131, the resistor 132, and the resistor 133. Note that in the case where the resistance value is expressed with a term "equal", "twice as large as", or the like in this specification and the like, an error is acceptable as long as an operation of a semiconductor device is not affected.

Relations of components of the memory cell 101 are described below.

A gate electrode of the transistor 111 is electrically connected to the first write selection line WSL_1. A source electrode of the transistor 111 is electrically connected to the first write data line WDL_1. A drain electrode of the transistor 111 is electrically connected to one electrode of the resistor 121.

A gate electrode of the transistor 112 is electrically connected to the second write selection line WSL_2. A source electrode of the transistor 112 is electrically connected to the second write data line WDL_2. A drain electrode of the transistor 112 is electrically connected to one electrode of the resistor 122.

A gate electrode of the transistor 113 is electrically connected to the selection line SL. A source electrode of the transistor 113 is electrically connected to the first power line PL_1. A drain electrode of the transistor 113 is electrically connected to one electrode of the resistor 133.

The other electrode of the resistor 121 is electrically connected to the node 103, one electrode of the capacitor 106, and one electrode of the resistor 131.

The other electrode of the resistor 122 is electrically connected to the other electrode of the resistor 131 and one electrode of the resistor 132.

The other electrode of the resistor 132 is electrically connected to the other electrode of the resistor 133.

The amplifier transistor 104 is an n-channel transistor and the gate electrode of the amplifier transistor 104 is electrically connected to the node 103. The source electrode of the amplifier transistor 104 is electrically connected to the second power line PL_2. The drain electrode of the amplifier transistor 104 is electrically connected to a source electrode of the selection transistor 105. The potential of the gate electrode of the amplifier transistor 104 is set depending on the first analog data. Further, a potential of the drain electrode of the amplifier transistor 104 is read as data in the memory cell 101.

A gate electrode and a drain electrode of the selection transistor 105 are electrically connected to the read selection line RSL and the read data line RDL, respectively.

The other electrode of the capacitor 106 is electrically connected to the first power line PL_1.

<Writing Operation>

Next, an example of a method for writing to the memory cell 101 will be described.

First, voltages at which the transistor 111 and the transistor 112 are turned on are applied to the first write selection line WSL_1 and the second write selection line WSL_2. In the case where the transistor 111 and the transistor 112 are n-channel transistors, a high potential (hereinafter, referred to as "H") and a low potential (hereinafter, referred to as "L") are applied to the write selection lines and the first power line PL_1, respectively.

At this time, a potential $V_{node}$ of the node 103 can be shown by Formula (1) when a potential of the first write data line WDL_1 is represented by $V_1$ and a potential of the second write data line WDL_2 is represented by $V_2$.

[FORMULA 1]

$$V_{node} = \frac{V_1}{2} + \frac{V_2}{4} \quad (1)$$

Specifically, when a potential corresponding to data 0 is represented by "0" and a potential corresponding to data 1 is represented by "V", the following relations are valid: $V_{node}$ is 0 when $(V_1, V_2)$ is $(0, 0)$, $V_{node}$ is V/4 when $(V_1, V_2)$ is $(0, n, V_{node}$ is V/2 when $(V_1, V_2)$ is $(V, 0)$, and $V_{node}$ is 3V/4 when ($V_1$, $V_2$) is (V, n. Accordingly, four-level voltage, that is, a voltage corresponding to two-bit data, can be output to the node 103.

As described above, two-bit data can be stored in the memory cell 101.

<Reading Operation>

Then, an example of a method for reading from the memory cell 101 will be described with reference to FIGS. 2A and 2B.

Figure 2A:
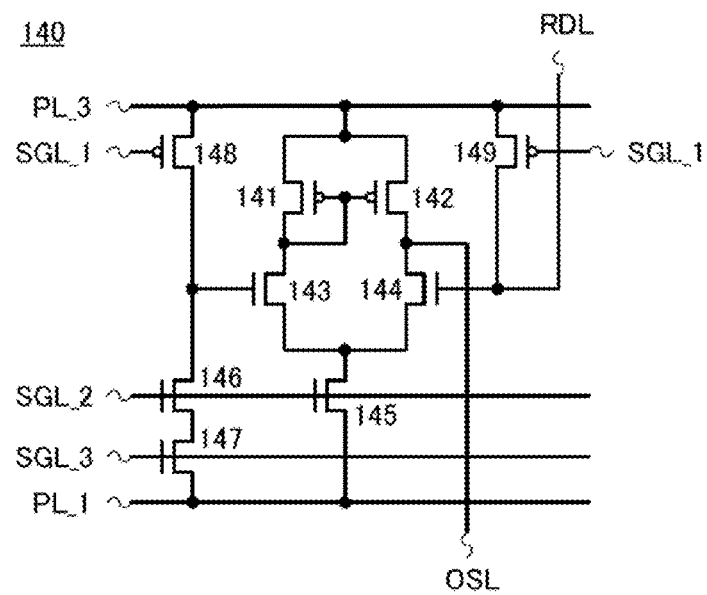
FIGS. 2A and 2B each illustrate a semiconductor device of one embodiment of the present invention.

A read circuit 140 illustrated in FIG. 2A is an example of a circuit that can be used for a reading operation of the memory cell 101.

The read circuit 140 is electrically connected to a first signal line SGL_1, a second signal line SGL_2, a third signal line SGL_3, the first power line PL_1, a third power line PL_3, an output signal line OSL, and the read data line RDL. The read circuit 140 has functions of reading data from the memory cell 101 and reconverting the data into the n-bit first digital data, for example. At this time, the data read from the memory cell 101 is analog data which is output through the amplifier transistor 104 and the selection transistor 105. The analog data is uniquely determined depending on a potential of the node 103 in the memory cell 101.

In addition, the read circuit 140 includes transistors 141 to 149.

Relations of components of the read circuit 140 are described below.

The transistor 141 is a p-channel transistor and a gate electrode of the transistor 141 is electrically connected to a drain electrode of the transistor 141, a drain electrode of the transistor 143, and a gate electrode of the transistor 142. A source electrode of the transistor 141 is electrically connected to the third power line PL_3.

The transistor 142 is a p-channel transistor and a source electrode of the transistor 142 is electrically connected to the third power line PL_3. A drain electrode of the transistor 142 is electrically connected to a source electrode of the transistor 144 and the output signal line OSL.

The transistor 143 is an n-channel transistor and a gate electrode of the transistor 143 is electrically connected to a drain electrode of the transistor 148 and a drain electrode of the transistor 146. A source electrode of the transistor 143 is electrically connected to a drain electrode of the transistor 144 and a drain electrode of the transistor 145.

The transistor 144 is an n-channel transistor and a gate electrode of the transistor 144 is electrically connected to a drain electrode of the transistor 149 and the read data line RDL.

The transistor 145 is an n-channel transistor and a gate electrode of the transistor 145 is electrically connected to a gate electrode of the transistor 146 and the second signal line SGL_2. A source electrode of the transistor 145 is electrically connected to the first power line PL_1.

The transistor 146 is an n-channel transistor and a source electrode of the transistor 146 is electrically connected to a drain electrode of the transistor 147.

The transistor 147 is an n-channel transistor and a gate electrode of the transistor 147 is electrically connected to the third signal line SGL_3. A source electrode of the transistor 147 is electrically connected to the first power line PL_1.

The transistor 148 is a p-channel transistor and a gate electrode of the transistor 148 is electrically connected to the first signal line SGL_1. A source electrode of the transistor 148 is electrically connected to the third power line PL_3.

The transistor 149 is a p-channel transistor and a gate electrode of the transistor 149 is electrically connected to the first signal line SGL_1. A source electrode of the transistor 149 is electrically connected to the third power line PL_3.

Here, the transistor 146 has electric characteristics equivalent to those of the selection transistor 105. Further, the transistor 147 has electric characteristics equivalent to those of the amplifier transistor 104. Furthermore, the transistor 148 has electric characteristics equivalent to those of the transistor 149.

Figure 2B:
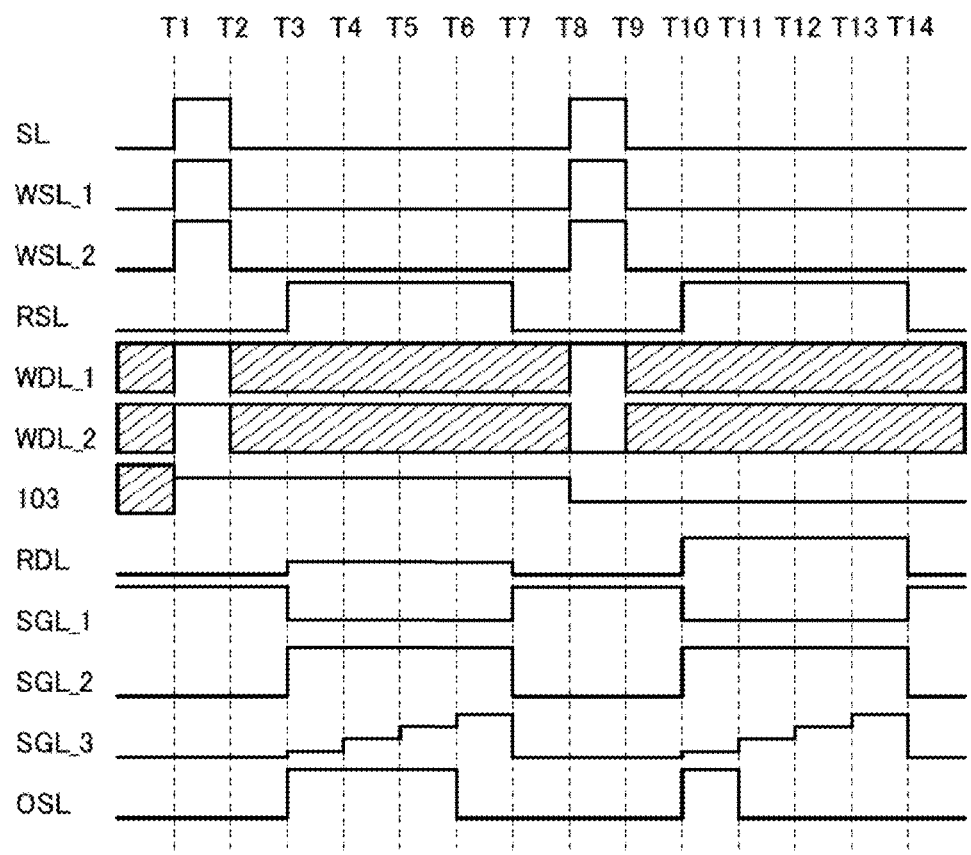

A timing chart of FIG. 2B illustrates an example of a method for reading in the case of using the memory cell 101 in FIG. 1B and the read circuit 140 in FIG. 2A. Here, a case where a potential of the first power line PL_1 is "L", a potential of the second power line PL_2 is "L", and a potential of the third power line PL_3 is "H" is described.

A first write operation, in which first data (($V_1$, $V_2$)=(V, V)) is written to the memory cell 101, is performed between time T1 and time T2.

Between the time T1 and the time T2, the selection line SL is at "H", the first write selection line WSL_1 is at "H", and the second write selection line WSL_2 is at "H". At this time, the transistors 111 to 113 are turned on, the potential of the node 103 becomes 3V/4, and the potential is held in the capacitor 106.

The first data is held in the memory cell 101 between the time T2 and time T8.

A first read operation, in which the first data is read from the memory cell 101, is performed between time T3 and time T7. The read selection line RSL is at "H" and the second signal line SGL_2 is at "H" between the time T3 and the time T7. Further, a potential of the first signal line SGL_1 is set to an appropriate potential. Note that an appropriate potential is, for example, a potential at which a potential of the gate electrode of the transistor 143 is changed when a potential of the gate electrode of the transistor 146 or 147 is changed. Here, the selection transistor 105 is turned on, and the potential of the gate electrode of the amplifier transistor 104, that is, the potential of the node 103, is output to the read data line RDL. The higher the potential of the node 103 is, the lower a potential of the read data line RDL.

Between the time T3 and time T4, a potential of the third signal line SGL_3 is set to V/8 (=0+V/8). Between the time T4 and time T5, the potential of the third signal line SGL_3 is set to 3V/8 (=V/4+V/8). Between the time T5 and time T6, the potential of the third signal line SGL_3 is set to 5V/8 (=V/2+V/8). Between the time T6 and the time T7, the potential of the third signal line SGL_3 is set to 7V/8 (=3V/4+V/8).

Here, in the case where the potential of the gate electrode of the transistor 143 is higher (lower) than that of the gate electrode of the transistor 144, "H" ("L") is output to the output signal line OSL. In the case where the potential of the gate electrode of the transistor 147 is higher (lower) than that of the gate electrode of the amplifier transistor 104, the potential of the gate electrode of the transistor 143 is lower (higher) than that of the gate electrode of the transistor 144. Accordingly, in the case where the potential of the gate electrode of the transistor 147 is higher (lower) than that of the gate electrode of the amplifier transistor 104, "L" ("H") is output to the output signal line OSL.

Between the time T3 and the time T6, the potential of the gate electrode of the transistor 147 is lower than that of the gate electrode of the amplifier transistor 104, so that "H" is output to the output signal line OSL. In contrast, the potential of the gate electrode of the transistor 147 is higher than that of the gate electrode of the amplifier transistor 104 between the time T6 and the time T7, so that "L" is output to the output signal line OSL.

A second write operation, in which second data (($V_1, V_2$)= (0, V)) is written to the memory cell 101, is performed between time T8 and time T9. Between the time T8 and the time T9, the selection line SL is at "H", the first write selection line WSL\_1 is at "H", and the second write selection line WSL\_2 is at "H". At this time, the transistors 111 to 113 are turned on, the potential of the node 103 becomes V/4, and the potential is held in the capacitor 106.

A second read operation, in which the second data is read from the memory cell 101, is performed between time T10 and time T14. The read selection line RSL is at "H" and the second signal line SGL\_2 is at "H" between the time T10 and the time T14. Further, the potential of the first signal line SGL\_1 is set to an appropriate potential. Here, the selection transistor 105 is turned on, and the potential of the gate electrode, that is, the potential of the node 103, is output to the read data line RDL. The higher the potential of the node 103 is, the lower the potential of the read data line RDL.

The second data is held in the memory cell 101 between the time T9 and time T14.

Between the time T10 and time T11, the potential of the third signal line SGL\_3 is set to V/8 (=0+V/8). Between the time T11 and time T12, the potential of the third signal line SGL\_3 is set to 3V/8 (=V/4+V/8). Between the time T12 and time T13, the potential of the third signal line SGL\_3 is set to 5V/8 (=V/2+V/8). Between the time T13 and the time T14, the potential of the third signal line SGL\_3 is set to 7V/8 (=3V/4+V/8).

Here, in the case where the potential of the gate electrode of the transistor 143 is higher (lower) than that of the gate electrode of the transistor 144, "H" ("L") is output to the output signal line OSL. In the case where the potential of the gate electrode of the transistor 147 is higher (lower) than that of the gate electrode of the amplifier transistor 104, the potential of the gate electrode of the transistor 143 is lower (higher) than that of the gate electrode of the transistor 144. Accordingly, in the case where the potential of the gate electrode of the transistor 147 is higher (lower) than that of the gate electrode of the amplifier transistor 104, "L" ("H") is output to the output signal line OSL.

Between the time T10 and the time T11, the potential of the gate electrode of the transistor 147 is lower than that of the gate electrode of the amplifier transistor 104, so that "H" is output to the output signal line OSL. In contrast, the potential of the gate electrode of the transistor 147 is higher than that of the gate electrode of the amplifier transistor 104 between the time T11 and the time T14, so that "L" is output to the output signal line OSL.

As described above, a period during which the output signal line OSL is at "H" varies depending on the level of the potential held in the node 103, that is, data written to the memory cell 101. This indicates that two-bit data can be stored in and read from the memory cell 101.

To improve the output accuracy of the D/A converter 102, it is preferable that the on-resistances of the transistor 111, the transistor 112, and the transistor 113 be each lower than each of the on-resistances of the resistor 121, the resistor 122, the resistor 131, the resistor 132, and the resistor 133. In addition, the on-resistance of the transistor 111 is preferably lower than each of the on-resistances of the transistors 112 and 113. Specifically, the on-resistance of the transistor 111 is preferably about half the on-resistance of each of the transistors 112 and 113.

To make the on-resistance of the transistor 111 lower than each of the on-resistances of the transistors 112 and 113, "H" of the selection line SL, "H" of the first write selection line WSL\_1, and "H" of the second write selection line WSL\_2 may be different from each other, for example.

In the case where each of the on-resistances of the transistors 111 to 113 is negligibly small compared with each of the resistances of the resistor 121, the resistor 122, the resistor 131, the resistor 132, and the resistor 133, the on-resistance of the transistor 111 is not necessarily lower than each of the on-resistances of the transistors 112 and 113. In that case, the selection line SL, the first write selection line WSL\_1, and the second write selection line WSL\_2 may be one selection line.

Although the memory cell 101 which can store two-bit data is described with reference to FIG. 1B and FIGS. 2A and 2B, the memory cell 101 can be fabricated to store three or more bits of data. In the case of the memory cell 101 capable of storing three-bit data, for example, a transistor, a resistor, a third write data line WDL\_3, a third write selection line WSL\_3, and the like can be additionally provided as needed.

An R-2R ladder D/A converter is used as the D/A converter 102 in FIG. 1B; however, the present invention is not limited thereto, and a different D/A converter such as a weighted resistor D/A converter, a weighted current D/A converter, or a weighted current ladder D/A converter may be used. In that case, different methods for writing and reading can be employed as appropriate.

Next, another example of the method for reading from the memory cell 101 will be described with reference to FIG. 9, FIGS. 10A and 10B, and FIG. 11.

First, another example of the read circuit is described below.

Figure 9:
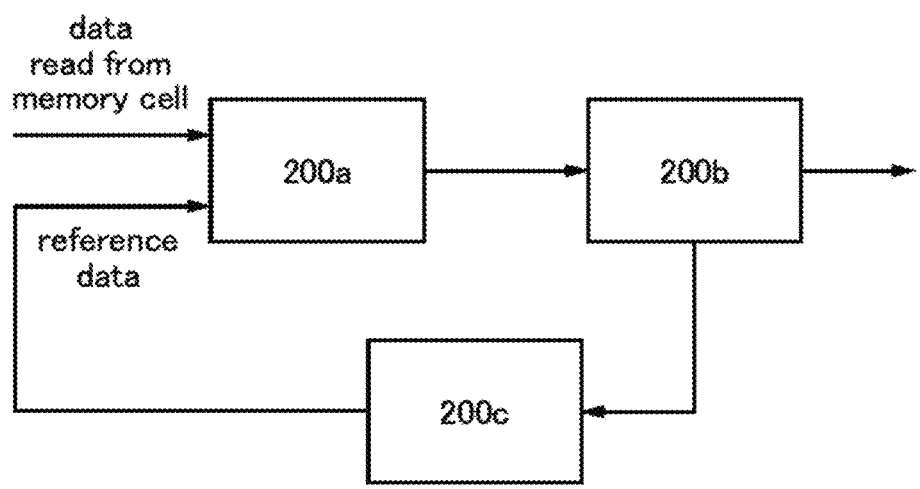
FIG. 9 illustrates a semiconductor device of one embodiment of the present invention.

A read circuit illustrated in FIG. 9 includes a comparator 200*a*, a successive approximation register 200*b*, and a D/A converter 200*c*. A successive approximation A-D converter is formed using the comparator 200*a*, the successive approximation register 200*b*, and the D/A converter 200*c*. Further, a reference data generation circuit is formed using the successive approximation register 200*b* and the D/A converter 200*c*.

The read circuit illustrated in FIG. 9 has functions of reading data from the memory cell 101 and reconverting the data into the n-bit first digital data.

The comparator 200*a* has a function of successively comparing the data read from the memory cell 101 to reference data.

The successive approximation register 200*b* has a function of successively setting a value of each bit of n-bit second digital data in accordance with successive comparison results obtained by the comparator 200*a*. The n-bit second digital data corresponds to the reconverted first digital data.

The D/A converter 200*c* has a function of successively converting the n-bit second digital data into second analog data.

An R-2R ladder D/A converter can be used as the D/A converter 200*c*.

Here, a configuration example of the read circuit will be described with reference to FIGS. 10A and 10B. Although the memory cell 101 which can store two-bit data is described as an example in FIGS. 10A and 10B, the present invention is not limited thereto, and the memory cell 101 can be easily fabricated to store more bits of data such as three bits or four bits.

Figure 10A:
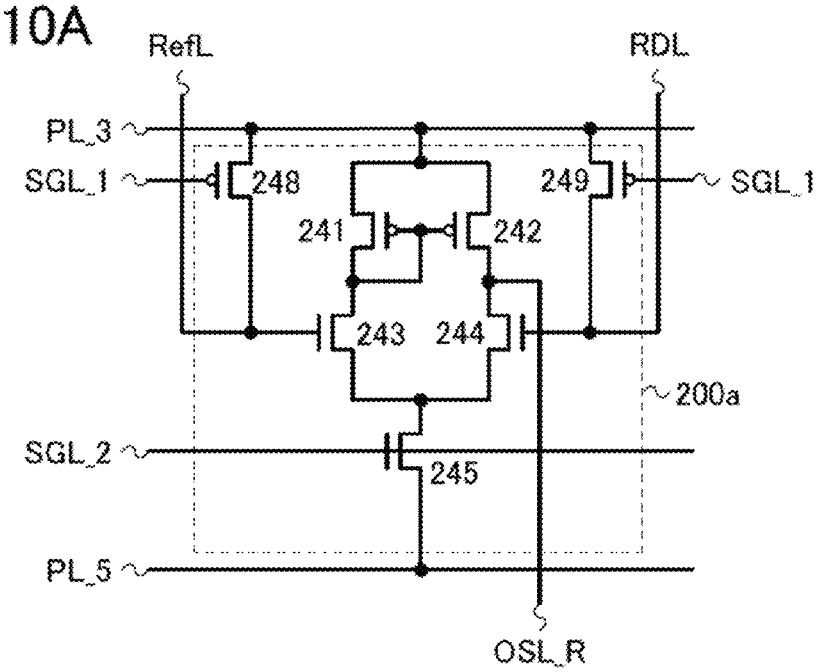
FIGS. 10A and 10B illustrate a semiconductor device of one embodiment of the present invention.

As illustrated in FIG. 10A, the comparator 200*a* includes a transistor 241, a transistor 242, a transistor 243, a transistor 244, a transistor 245, a transistor 248, and a transistor 249.

Relations of components of the comparator 200*a* are described below.

The transistor 241 is a p-channel transistor and corresponds to the transistor 141 of the read circuit 140 illustrated in FIG. 2A. A gate electrode of the transistor 241 is electrically connected to a drain electrode of the transistor 241, a drain electrode of the transistor 243, and a gate electrode of the transistor 242. A source electrode of the transistor 241 is electrically connected to the third power line PL_3.

The transistor 242 is a p-channel transistor and corresponds to the transistor 142 of the read circuit 140 illustrated in FIG. 2A. A source electrode of the transistor 242 is electrically connected to the third power line PL_3. A drain electrode of the transistor 242 is electrically connected to a source electrode of the transistor 244 and an output signal line OSL_R.

The transistor 243 is an n-channel transistor and corresponds to the transistor 143 of the read circuit 140 illustrated in FIG. 2A. A gate electrode of the transistor 243 is electrically connected to a drain electrode of the transistor 248 and a reference data line RefL. A source electrode of the transistor 243 is electrically connected to a drain electrode of the transistor 244 and a drain electrode of the transistor 245.

The transistor 244 is an n-channel transistor and corresponds to the transistor 144 of the read circuit 140 illustrated in FIG. 2A. A gate electrode of the transistor 244 is electrically connected to a drain electrode of the transistor 249 and the read data line RDL.

The transistor 245 is an n-channel transistor and corresponds to the transistor 145 of the read circuit 140 illustrated in FIG. 2A. A gate electrode of the transistor 245 is electrically connected to the second signal line SGL_2. A source electrode of the transistor 245 is electrically connected to a fifth power line PL_5.

The transistor 248 is a p-channel transistor and corresponds to the transistor 148 of the read circuit 140 illustrated in FIG. 2A. A gate electrode of the transistor 248 is electrically connected to the first signal line SGL_1. A source electrode of the transistor 248 is electrically connected to the third power line PL_3.

The transistor 249 is a p-channel transistor and corresponds to the transistor 149 of the read circuit 140 illustrated in FIG. 2A. A gate electrode of the transistor 249 is electrically connected to the first signal line SGL_1. A source electrode of the transistor 249 is electrically connected to the third power line PL_3.

Here, the transistor 248 has electric characteristics equivalent to those of the selection transistor 249.

Figure 10B:
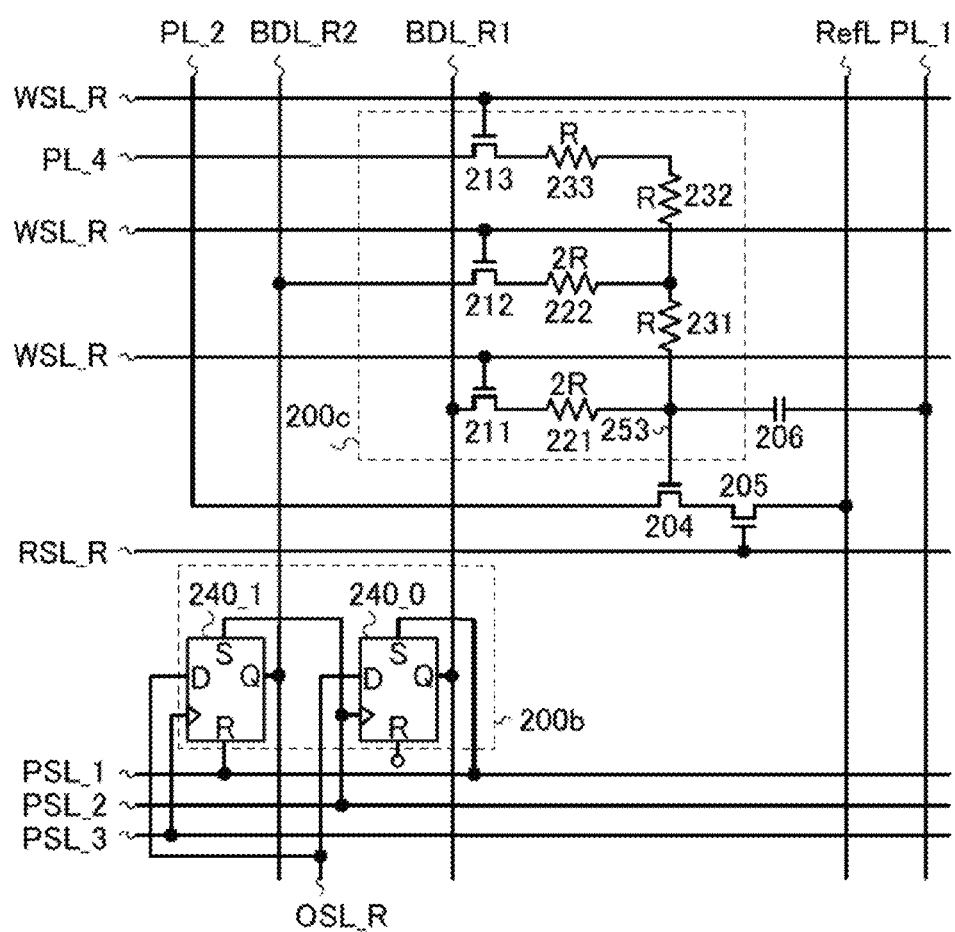

The successive approximation register 200b includes, as illustrated in FIG. 10B, SR flip-flops 240_0 and 240_1 each of which is provided to hold one bit of the n-bit (here, n is two) second digital data. Here, the SR flip-flop 240_0 is provided for the nought bit data and the SR flip-flop 240_1 is provided for the first bit data. As in above, each bit of digital data is expressed as the nought bit and the first bit starting from a lower bit in some cases. For example, two-bit digital data is composed of the nought bit data and the first bit data.

A clock terminal, a terminal D, a terminal Q, and a terminal S of the SR flip-flop 240_0 are electrically connected to a second pulse signal line PSL_2, the output signal line OSL_R, a first bit data line BDL_R1, and a first pulse signal line PSL_1, respectively. A low potential or a ground potential is applied to a terminal R of the SR flip-flop 240_0.

A clock terminal, a terminal D, a terminal Q, a terminal S, and a terminal R of the SR flip-flop 240_1 are electrically connected to a third pulse signal line PSL_3, the output signal line OSL_R, a second bit data line BDL_R2, the second pulse signal line PSL_2, and the first pulse signal line PSL_1, respectively.

Each of the SR flip-flops 240_0 and 240_1 outputs "H" to the terminal Q when "H" is input to the terminal S, and outputs "L" to the terminal Q when "H" is input to the terminal R. Further, each of the SR flip-flops 240_0 and 240_1 is synchronized with a rising edge of a pulse signal input through the clock terminal to output a potential of the terminal D as a signal to the terminal Q.

An R-2R ladder D/A converter can be used as the D/A converter 200c. The D/A converter 200c includes a resistor 221, a resistor 222, a resistor 231, a resistor 232, and a resistor 233. Note that the D/A converter 200c can include transistors 211 to 213 as illustrated in FIG. 10B; however, the present invention is not limited thereto and the transistors 211 to 213 may be provided separately from the D/A converter 200c. The transistors 211 to 213 are not necessarily provided. Further, the read circuit includes an amplifier transistor 204 as illustrated in FIG. 10B. The read circuit may include a selection transistor 205 and a capacitor 206.

In the R-2R ladder D/A converter 200c, the resistance values of the resistor 221 and the resistor 222 are equal, for example. Further, the resistance values of the resistor 231, the resistor 232, and the resistor 233 are equal. Furthermore, the resistance values of the resistor 221 and the resistor 222 are each twice as large as each of the resistance values of the resistor 231, the resistor 232, and the resistor 233. Note that the present invention is not limited thereto and the resistance values of the resistors may be set as appropriate depending on the design specification of the D/A converter 200c.

The D/A converter 102 and the D/A converter 200c each includes a plurality of resistors, and sources or drains of a plurality of transistors may be electrically connected to each other through the plurality of resistors. Thus, an increase in circuit area can be prevented.

A gate electrode of the transistor 211 is electrically connected to a write selection line WSL_R. A source electrode of the transistor 211 is electrically connected to the first bit data line BDL_R1. A drain electrode of the transistor 211 is electrically connected to one electrode of the resistor 221. In the read circuit, a potential corresponding to one-bit data can be input to each of the first bit data line BDL_R1 and the second bit data line BDL_R2.

A gate electrode of the transistor 212 is electrically connected to the write selection line WSL_R. A source electrode of the transistor 212 is electrically connected to the second bit data line BDL_R2. A drain electrode of the transistor 212 is electrically connected to one electrode of the resistor 222.

A gate electrode of the transistor 213 is electrically connected to the write selection line WSL_R. A source electrode of the transistor 213 is electrically connected to a fourth power line PL_4. A drain electrode of the transistor 213 is electrically connected to one electrode of the resistor 233.

The n-bit (here, n is two) second digital data is input to the D/A converter 200c illustrated in FIG. 10B. At this time, each bit of data of the n-bit (here, n is two) second digital data is input to the D/A converter 200c through a corresponding bit data line (one of the first bit data line BDL_R1 and the second bit data line BDL_R2).

The other electrode of the resistor 221 is electrically connected to one electrode of the capacitor 206 and one electrode of the resistor 231.

The other electrode of the resistor 222 is electrically connected to the other electrode of the resistor 231 and one electrode of the resistor 232.

The other electrode of the resistor 232 is electrically connected to the other electrode of the resistor 233.

A gate electrode of the amplifier transistor 204 is electrically connected to the drain electrode of the transistor 211 through the resistor 221. Further, the gate electrode of the amplifier transistor 204 is electrically connected to the drain electrode of the transistor 212 through the resistors 231 and 222. Furthermore, the gate electrode of the amplifier transistor 204 is electrically connected to the drain electrode of the transistor 213 through the resistors 231, 232, and 233. A connection portion of the other electrode of the resistor 221, the one electrode the resistor 231, the one electrode of the capacitor 206, and the gate electrode of the amplifier transistor 204 is denoted by a node 253, in this case. A source electrode of the amplifier transistor 204 is electrically connected to the second power line PL_2. A drain electrode of the amplifier transistor 204 is electrically connected to a source electrode of the selection transistor 205.

A potential of the gate electrode of the amplifier transistor 204 is set depending on the second analog data. Further, a potential of the drain electrode of the amplifier transistor 204 is output as reference data.

A gate electrode and a drain electrode of the selection transistor 205 are electrically connected to a read selection line RSL_R and the reference data line RefL, respectively.

The other electrode of the capacitor 206 is electrically connected to the first power line PL_1.

The read circuit may be formed by stacking the transistors 211 to 213, which enables a reduction in area of the read circuit. As the transistors which can be stacked, thin film transistors can be given as an example.

In the read circuit, the transistor 211 preferably has the same electric characteristics as the transistor 111, the transistor 212 preferably has the same electric characteristics as the transistor 112, and the transistor 213 preferably has the same electric characteristics as the transistor 113. Accordingly, an error which is made at the time of reconverting the data in the memory cell 101 to the first digital data can be made small.

Further, in the read circuit, it is preferable that the on-resistances of the transistor 211, the transistor 212, and the transistor 213 be each lower than each of the on-resistances of the resistor 221, the resistor 222, the resistor 231, the resistor 232, and the resistor 233 so that the output accuracy of the D/A converter 200c is improved.

In addition, the on-resistance of the transistor 211 may be lower than each of the on-resistances of the transistors 212 and 213. Specifically, the on-resistance of the transistor 211 may be about half the on-resistance of each of the transistors 212 and 213. To make the on-resistance of the transistor 211 lower than the on-resistance of the transistors 212 and 213, the write selection line electrically connected to the gate electrode of the transistor 211 and the write selection line electrically connected to the gate electrodes of the transistors 212 and 213 may be separately provided, so that potentials of the write selection lines differ from each other, for example.

In the case where the memory cell 101 capable of storing three or more bits of data is used, a transistor, a resistor, a bit data line, a write selection line, and the like can be additionally provided in the read circuit as needed.

An R-2R ladder D/A converter is used as the D/A converter 200c in FIG. 10B; however, the present invention is not limited thereto, and a different D/A converter such as a weighted resistor D/A converter, a weighted current D/A converter, or a weighted current ladder D/A converter may be used. In that case, different methods for writing and reading can be employed as appropriate.

Then, an example of a method for reading stored data from the memory cell 101 in the case of using a read circuit having a structure illustrated in FIG. 9 and FIGS. 10A and 10B is described with reference to a timing chart of FIG. 11. Here, a case where the potential of the first power line PL_1 is "V/2", the potential of the second power line PL_2 is "L", the potential of the third power line PL_3 is "H", a potential of the fourth power line PL_4 is "L", and a potential of the fifth power line PL_5 is "L" is described as an example. Since the potential of the first power line PL_1 and the potential of the fourth power line PL_4 are different from each other, a potential of the output signal line OSL_R can be prevented from being an undefined value.

A first write operation, in which two-bit data $((V_1, V_2)=(V, V))$ is written as the first digital data to the memory cell 101, is performed between time T1 and time T2. Note that "V" is substantially equal to "H".

Between the time T1 and the time T2, the selection line SL is at "H", the first write selection line WSL_1 is at "H", and the second write selection line WSL_2 is at "H". At this time, the transistors 111 to 113 of the memory cell 101 are turned on. Further, two-bit first digital data (V, V) is converted to the first analog data by the resistors 121, 122, 131, 132, and 133 in the D/A converter 102, so that the potential of the node 103 is 7V/8. In addition, the first analog data is held in the capacitor 106.

The first analog data is held in the memory cell 101 between the time T2 and time T7. In other words, the first analog data is stored in the memory cell 101.

A first read operation, in which the first analog data is read from the memory cell 101, is performed between time T3 and time T5. The read selection line RSL is at "H", the second signal line SGL_2 is at "H", the write selection line WSL_R is at "H", and the read selection line RSL_R is at "H", between the time T3 and the time T5. Further, the potential of the first signal line SGL_1 is set to an appropriate potential. Note that an appropriate potential is, for example, a potential at which a potential of the gate electrode of the transistor 243 is changed when the potential of the gate electrode of the amplifier transistor 204 or the selection transistor 205 is changed.

At this time, the selection transistor 105 is turned on, and the potential of the gate electrode of the amplifier transistor 104, that is, a potential corresponding to the potential of the node 103 is output as the first analog data to the read data line RDL. In the read circuit, the transistors 211 to 213 are turned on, and two-bit second digital data is converted to the second analog data by the resistors 221, 222, 231, 232, and 233 in the D/A converter 200c. In addition, the selection transistor 205 is turned on, and the potential of the gate electrode of the amplifier transistor 204, that is, a potential corresponding to a potential of the node 253 is output as reference data to the reference data line RefL.

The first pulse signal line PSL_1 is at "H" between the time T3 and time T4.

Since the terminal S of the SR flip-flop 2400 is at "H" at this time, the terminal Q thereof is at "H" in the successive approximation register 200b. In contrast, since the terminal R of the SR flip-flop 240_1 is at "H", the terminal Q thereof is at "L". That is, the first bit data line BDL_R1 is at "H", the second bit data line BDL_R2 is at "L", and the potential of the node 253 is V/2.

The potential of the node 253 (V/2) is lower than that of the node 103 (7V/8) at this time; thus, a potential of the reference data line RefL is higher than that of the read data line RDL in the comparator 200a. As a result, the output signal line OSL_R is at "H".

The second pulse signal line PSL_2 is at "H" between the time T4 and the time T5.

Since the terminal D of the SR flip-flop 2400 is at "H" at this time, the terminal Q thereof is at "H" in the successive approximation register 200b. In contrast, since the terminal S of the SR flip-flop 240_1 is at "H", the terminal Q thereof is at "H". That is, the first bit data line BDL_R1 remains "H", the second bit data line BDL_R2 is at "L", and the potential of the node 253 is 3V/4. Further, a potential corresponding to the potential of the node 253 is output to the reference data line RefL.

The potential of the node 253 (3V/4) is lower than that of the node 103 (7V/8) at this time; thus, the potential of the reference data line RefL is higher than that of the read data line RDL in the comparator 200a. As a result, the output signal line OSL_R is at "H".

The third pulse signal line PSL_3 is at "H" between the time T5 and the time T6.

At this time, since the terminal D of the SR flip-flop 240_1 is at "H", the terminal Q thereof is at "H" in the successive approximation register 200b. That is, the first bit data line BDL_R1 and the second bit data line BDL_R2 remain "H". A set of signals ("H", "H") of the first bit data line BDL_R1 and the second bit data line BDL_R2, which is obtained at this time, is the second digital data (($V_1$, $V_2$)=(V, V)) corresponding to the first analog data stored in the memory cell 101. The second digital data obtained at this time corresponds to the first digital data, which means that the first analog data is reconverted to the first digital data.

A second write operation, in which two-bit data (($V_1$, $V_2$)=(0, V)) is written as the first digital data to the memory cell 101, is performed between time T7 and time T8.

Between the time T7 and the time T8, the selection line SL is at "H", the first write selection line WSL_1 is at "H", and the second write selection line WSL_2 is at "H". At this time, the transistors 111 to 113 of the memory cell 101 are turned on. Further, the two-bit first digital data (V, V) is converted to the first analog data by the resistors 121, 122, 131, 132, and 133 in the D/A converter 102, so that the potential of the node 103 is 3V/8. In addition, the first analog data is held in the capacitor 106.

The first analog data is held in the memory cell 101 between the time T7 and time T12. In other words, the first analog data is stored in the memory cell 101.

A second read operation, in which the first analog data is read from the memory cell 101, is performed between time T9 and time T11. The read selection line RSL is at "H", the second signal line SGL_2 is at "H", the write selection line WSL_R is at "H", and the read selection line RSL_R is at "H", between the time T9 and the time T11. Further, the potential of the first signal line SGL_1 is set to an appropriate potential.

At this time, the selection transistor 105 is turned on, and the potential of the gate electrode of the amplifier transistor 104, that is, a potential corresponding to the potential of the node 103 is output as the first analog data to the read data line RDL. In the read circuit, the transistors 211 to 213 are turned on, and the two-bit second digital data is converted to the second analog data in the D/A converter 200c. In addition, the selection transistor 205 is turned on, and the potential of the gate electrode of the amplifier transistor 204, that is, a potential corresponding to the potential of the node 253 is output as reference data to the reference data line RefL.

The first pulse signal line PSL_1 is at "H" between the time T9 and time T10.

Since the terminal S of the SR flip-flop 240_0 is at "H" at this time, the terminal Q thereof is at "H" in the successive approximation register 200b. In contrast, since the terminal R of the SR flip-flop 240_1 is at "H", the terminal Q thereof is at "L" in the successive approximation register 200b. That is, the first bit data line BDL_R1 is at "H", the second bit data line BDL_R2 is at "L", and the potential of the node 253 is V/2.

The potential of the node 253 (V/2) is higher than that of the node 103 (3V/8) at this time; thus, the potential of the reference data line RefL is lower than that of the read data line RDL in the comparator 200a. As a result, the output signal line OSL_R is at The second pulse signal line PSL_2 is at "H" between the time T10 and the time T11.

Since the terminal D of the SR flip-flop 240_0 is at "L" at this time, the terminal Q thereof is at "H" in the successive approximation register 200b. In contrast, since the terminal S of the SR flip-flop 240_1 is at "H", the terminal Q thereof is at "H". That is, the first bit data line BDL_R1 is at "L", the second bit data line BDL_R2 is at "H", and the potential of the node 253 is V/4. Further, a potential corresponding to the potential of the node 253 is output to the reference data line RefL.

The potential of the node 253 (V/4) is lower than that of the node 103 (3V/8) at this time; thus, the potential of the reference data line RefL is higher than that of the read data line RDL in the comparator 200a. As a result, the output signal line OSL_R is at "H".

The third pulse signal line PSL_3 is at "H" between the time T11 and the time T12.

At this time, since the terminal D of the SR flip-flop 240_1 is at "H", the terminal Q thereof is at "H". That is, the first bit data line BDL_R1 remains "L" and the second bit data line BDL_R2 remains "H". A set of signals ("L", "H") of the first bit data line BDL_R1 and the second bit data line BDL_R2, which is obtained at this time, is the first digital data (($V_1$, $V_2$)=(0, V)) corresponding to the first analog data stored in the memory cell 101.

As described above, signals of the first bit data line BDL_R1 and the second bit data line BDL_R2 are changed depending on data written to the memory cell 101. Accordingly, plural bits of data can be stored in and read from the memory cell.

Note that it is effective to separately provide a flip-flop to which output signals (the potentials of the terminals Q) of the SR flip-flops 240_0 and 240_1 are input and electrically connect a clock terminal of the flip-flop to the third pulse signal line PSL_3. With such a structure, data can be successively read.

As described with reference to FIG. 9, FIGS. 10A and 10B, and FIG. 11, a read circuit including a comparator, a successive approximation register, and a D/A converter can reduce the number of comparison operations for determining a value of each bit of digital data, so that a period necessary for the operation can be shortened. In addition, in the case of having a plurality of memory cells, the semiconductor device of this embodiment does not require writeback (or verification) of data to memory cells from which data is not read at the time of reading, which is necessary for a flash memory and the like.

Embodiment 2

In this embodiment, a semiconductor device of one embodiment of the present invention will be described with reference to FIG. 3.

<Memory Cell Array>

A plurality of the memory cells described in Embodiment 1 can be arranged to form a memory cell array. FIG. 3 is a block circuit diagram of a semiconductor device including a memory cell array 201 in which m×k (m and k are natural numbers) memory cells 101 are arranged, for example.

The semiconductor device of one embodiment of the present invention includes m power lines PL_1 to PL_m, m×n write data lines WDL_1_1 to WDL_m_n, m read data lines RDL_1 to RDL_m, k write selection lines WSL_1 to WSL_k, the memory cell array 201 in which memory cells 101(1, 1) to 101(k, m) are arranged in matrix of k (in the longitudinal direction)×m (in the lateral direction), a driver circuit 202, and a driver circuit 203.

The driver circuit 202 is electrically connected to the m power lines PL_1 to PL_m, the m×n write data lines WDL_1_1 to WDL_m_n, and the m read data lines RDL_1 to RDL_m. The driver circuit 203 is electrically connected to the k write selection lines WSL_1 to WSL_k.

The driver circuit 202 includes a read circuit to which the m read data lines RDL_1 to RDL_m are electrically connected. As the read circuit, the read circuit described with reference to FIG. 2A or that described with reference to FIG. 9, FIGS. 10A and 10B, and FIG. 11 can be used. The driver circuit 202 further includes a power line driver circuit to which the m power lines PL_1 to PL_m are electrically connected, and the like.

The driver circuit 203 includes a write selection line driver circuit to which the k write selection lines WSL_1 to WSL_k are electrically connected, and the like.

Figure 3:
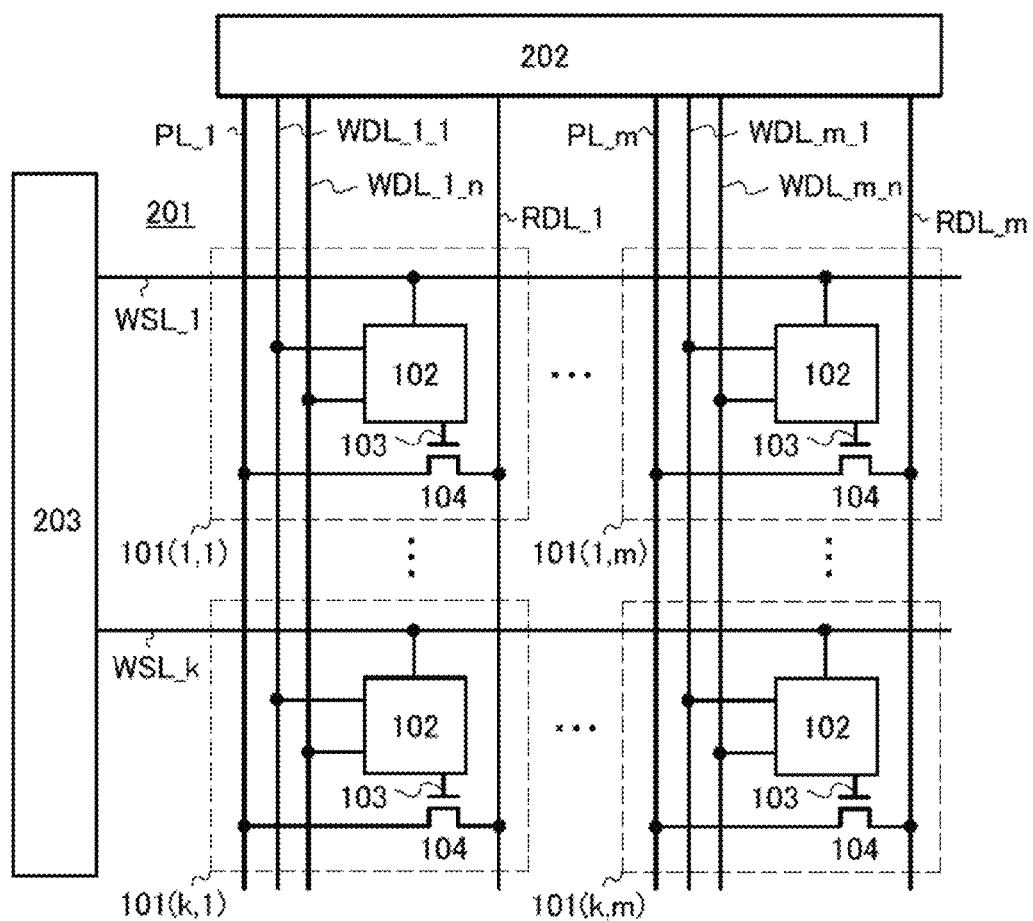
FIG. 3 illustrates a semiconductor device of one embodiment of the present invention.

Note that although FIG. 3 illustrates an example which includes the memory cell 101 described with reference to FIG. 1A, the present invention is not limited thereto and may have a structure which includes the memory cell 101 described with reference to FIG. 1B, for example. In the case of using the memory cell 101 described with reference to FIG. 1B, the semiconductor device can include k selection lines SL 1 to SL_k, k first write selection lines WSL_1_1 to WSL_1_k, k second write selection lines WSL_2_1 to WSL_2_k, m first power lines PL_1_1 to PL_1_m, m second power lines PL_2_1 to PL_2_m, m first write data lines WDL_1_1 to WDL_1_m, m second write data lines WDL_2_1 to WDL_2_m, and the m read data lines RDL_1 to RDL_m.

A refresh circuit or the like may be provided as a peripheral circuit.

Embodiment 3

In this embodiment, a transistor that can be used for a semiconductor device of one embodiment of the present invention will be described.

As described in Embodiment 1, each memory cell in the semiconductor device of one embodiment of the present invention includes a D/A converter. The D/A converter includes a plurality of transistors (e.g., the transistors 111 to 113).

In the case where the transistors in the D/A converter are stacked, a thin film semiconductor is preferably used for a channel formation region of the transistor. The thin film semiconductor can be formed by, for example, a sputtering method, an evaporation method, a CVD method, or the like using silicon (e.g., amorphous silicon, low temperature polysilicon, or microcrystalline silicon), an oxide semiconductor, an organic semiconductor, or the like as a material.

In particular, with the use of a transistor including an oxide semiconductor in a channel formation region, off-state current can be extremely low.

The energy gap of the oxide semiconductor is 2.8 eV to 3.2 eV, and is greater than that of silicon, 1.1 eV. The intrinsic carrier density of the oxide semiconductor is $10^{-9}/cm^3$, which is extremely smaller than that of silicon, $10^{11}/cm^3$.

Majority carriers (electrons) of the oxide semiconductor which is used for the channel formation region of the transistor flow only from a source of the transistor. Further, the channel formation region can be depleted completely, enabling off-state current of the transistor to be extremely small. The off-state current of the transistor including an oxide semiconductor is as small as 10 yA/μm or less at room temperature, or 1 zA/μm or less at 85° C. to 95° C.

Thus, in the case of using an oxide semiconductor for the transistor included in the D/A converter, a nonvolatile semiconductor device with excellent charge retention characteristics can be easily obtained. In this embodiment, a thin film oxide semiconductor is used for the channel formation region of the transistor included in the D/A converter.

For channel formation regions of the amplifier transistor 104 and the selection transistor 105 included in each of the memory cells and the transistors 141 to 149 included in the read circuit 140, not only the thin film semiconductor but also any semiconductor can be used. For example, single crystal silicon, germanium (Ge), gallium arsenide (GaAs), indium phosphide (InP), gallium nitride (GaN), and the like can also be used. In this embodiment, single crystal silicon is used for the channel formation regions of the amplifier transistor 104, the selection transistor 105, and the transistors 141 to 149 included in the read circuit 140.

Transistors each of which can be used for the D/A converter (e.g., the transistors 111 to 113) will be described in detail below with reference to FIGS. 4A to 4D.

Figure 4A:
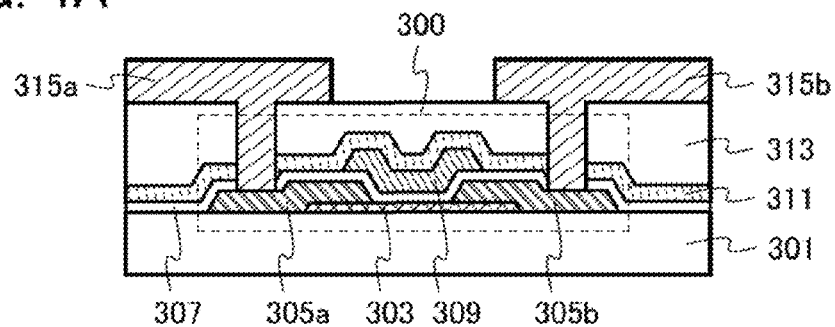
FIGS. 4A to 4D each illustrate a semiconductor device of one embodiment of the present invention.

A transistor 300 illustrated in FIG. 4A includes, over a substrate 301 having an insulating surface, an oxide semiconductor film 303, a source electrode 305a and a drain electrode 305b which are in contact with the oxide semiconductor film 303, and a gate electrode 309 which overlaps with the oxide semiconductor film 303 with a gate insulating film 307 provided therebetween.

A wiring 315a which is electrically connected to the source electrode 305a and a wiring 315b which is electrically connected to the drain electrode 305b may be provided. Further, an insulating film 311 and an insulating film 313 may be provided over the transistor 300.

The oxide semiconductor film 303 included in the transistor 300 is in a single crystal state, a polycrystalline (also referred to as polycrystal) state, an amorphous state, or the like. Further, the oxide semiconductor film 303 is preferably a CAAC-OS (c-axis aligned crystalline oxide semiconductor) film.

The CAAC-OS film is not completely single crystal. In an image obtained with a transmission electron microscope (TEM), for example, crystal parts can be found in the CAAC-OS in some cases. Note that in most cases, a crystal part in the CAAC-OS fits inside a cube whose one side is less than 100 nm, for example. In an image obtained with the TEM, a boundary between the crystal parts is not clearly detected is some cases. Further, with the TEM, a grain boundary in the CAAC-OS film might not be found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light is small. Thus, the transistor has high reliability.

Examples of a material that can be used for the transistor 300 and a method for manufacturing the transistor 300 will be described below.

<Substrate>

There is no particular limitation on a substrate that can be used as the substrate 301 having an insulating surface as long as it has at least heat resistance enough to withstand heat treatment in a later step. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 301, or the substrate provided with a semiconductor element can be used as the substrate 301.

The semiconductor device may be manufactured using a flexible substrate as the substrate 301. To manufacture a flexible semiconductor device, the transistor 300 including the oxide semiconductor film 303 may be directly formed over a flexible substrate; or alternatively, the transistor 300 including the oxide semiconductor film 303 may be formed over a manufacturing substrate and then separated and transferred to a flexible substrate. Note that in order to separate the transistor 300 from the manufacturing substrate and transfer it to the flexible substrate, a separation layer may be provided between the manufacturing substrate and the transistor 300 including the oxide semiconductor film.

Alternatively, a base insulating film may be provided over the substrate 301 and the semiconductor device may be manufactured over the base insulating film. The base insulating film can be formed by a plasma CVD method, a sputtering method, or the like to have a single-layer structure including silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material including any of them, or a stacked-layer structure including any of the above materials. Note that the base insulating film preferably has a single-layer structure or a stacked-layer structure including an oxide insulating layer so that the oxide insulating layer is in contact with the oxide semiconductor film 303 to be formed later.

It is preferable that the base insulating film include an oxygen excess region. This is because oxygen vacancies in the oxide semiconductor film 303, which is formed in a later step, can be filled with excess oxygen contained in the base insulating film. In the case where the base insulating film has a stacked-layer structure, an oxygen excess region is preferably included in at least a layer (preferably, an oxide insulating layer) in contact with the oxide semiconductor film 303. To provide the oxygen excess region in the base insulating film, for example, the base insulating film may be formed in an oxygen atmosphere. Alternatively, the oxygen excess region may be formed by introducing oxygen (including at least one of an oxygen radical, an oxygen atom, and an oxygen ion) into the base insulating film after its formation. Oxygen can be introduced by an ion implantation method, an ion doping method, a plasma immersion ion implantation method, plasma treatment, or the like.

The base insulating film preferably includes a silicon nitride film, a silicon nitride oxide film, or an aluminum oxide film being in contact with the bottom surface of a layer having an oxygen excess region. When the base insulating film includes a silicon nitride film, a silicon nitride oxide film, or an aluminum oxide film, diffusion of an impurity to the oxide semiconductor film 303 can be prevented.

<Oxide Semiconductor Film>

Next, an oxide semiconductor film is formed over the substrate 301 and is processed into an island shape to form the oxide semiconductor film 303. The thickness of the oxide semiconductor film 303 is, for example, 1 nm to 30 nm, preferably 5 nm to 10 nm.

The oxide semiconductor film may have either a single-layer structure or a stacked-layer structure. Further, the oxide semiconductor film may have either an amorphous structure or a crystalline structure. In the case where the oxide semiconductor film has an amorphous structure, heat treatment may be performed on the oxide semiconductor film in a later manufacturing step so that the oxide semiconductor film has crystallinity. The heat treatment for crystallizing the amorphous oxide semiconductor film is performed at a temperature higher than or equal to 250° C. and lower than or equal to 700° C., preferably higher than or equal to 400° C., further preferably higher than or equal to 500° C., even further preferably higher than or equal to 550° C. Note that the heat treatment can also serve as another heat treatment in the manufacturing process.

As a method for forming the oxide semiconductor film, a sputtering method, a molecular beam epitaxy (MBE) method, a chemical vapor deposition (CVD) method, a pulse laser deposition method, an atomic layer deposition (ALD) method, or the like can be used as appropriate.

In the formation of the oxide semiconductor film, the hydrogen concentration in the oxide semiconductor film is preferably reduced as much as possible. To reduce the hydrogen concentration, for example, in the case where the oxide semiconductor film is formed by a sputtering method, oxygen, a high-purity rare gas (a typical example thereof is argon) from which impurities such as hydrogen, water, a hydroxyl group, and a hydride are removed, or a mixed gas of oxygen and the rare gas is used as appropriate as an atmosphere gas supplied to a deposition chamber of a sputtering apparatus.

The oxide semiconductor film is formed in such a manner that a sputtering gas from which hydrogen and moisture are removed is introduced into a deposition chamber while moisture remaining in the deposition chamber is removed, whereby the concentration of hydrogen in the deposited oxide semiconductor film can be reduced. To remove moisture remaining in the deposition chamber, an entrapment vacuum pump such as a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; thus, the impurity concentration in the oxide semiconductor film formed in the deposition chamber which is evacuated with the cryopump can be reduced.

Further, when the oxide semiconductor film is formed by a sputtering method, the relative density (filling rate) of a metal oxide target that is used for the deposition is greater than or equal to 90% and less than or equal to 100%, preferably greater than or equal to 95% and less than or equal to 99.9%. With use of a metal oxide target with a high relative density, a dense oxide semiconductor film can be deposited.

Further, to reduce the impurity concentration in the oxide semiconductor film, it is also effective to form the oxide semiconductor film while the substrate 301 is kept at high temperatures. The temperature at which the substrate 301 is heated may be higher than or equal to 150° C. and lower than or equal to 450° C.; the substrate temperature is preferably higher than or equal to 200° C. and lower than or equal to 350° C. The crystalline oxide semiconductor film can be formed by heating the substrate at high temperatures in the formation.

An oxide semiconductor used for the oxide semiconductor film 303 preferably contains at least indium (In). In particular, indium and zinc (Zn) are preferably contained. As a stabilizer for reducing variation in electric characteristics of a transistor using the oxide semiconductor, gallium (Ga) is preferably additionally contained. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio where In:Ga:Zn=1:1:1, In:Ga:Zn=2:2:1, In:Ga:Zn=3:1:2, or any of oxides whose composition is in the neighborhood of the above compositions can be used. Alternatively, an In—Sn—Zn-based oxide with an atomic ratio where In:Sn:Zn=1:1:1, In:Sn:Zn=2:1:3, or In:Sn:Zn=2:1:5, or any of oxides whose composition is in the neighborhood of the above compositions may be used.

However, an oxide semiconductor containing indium that is included in a transistor is not limited to the materials given above; a material with an appropriate composition may be used for a transistor including an oxide semiconductor containing indium depending on needed electrical characteristics (e.g., field-effect mobility, threshold voltage, and variation). To obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. For example, r may be 0.05. The same applies to other oxides.

The oxide semiconductor film 303 may have a single-layer structure or a stacked-layer structure of a plurality of oxide semiconductor films. For example, the oxide semiconductor film 303 may be a stacked layer of a first oxide semiconductor film and a second oxide semiconductor film which are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using three-component metal oxides.

Further, the constituent elements of the first oxide semiconductor film and the second oxide semiconductor film may be the same as each other but the composition of the constituent elements of the first oxide semiconductor film and the second oxide semiconductor film may be different from each other. For example, the atomic ratio of In to Ga and Zn in the first oxide semiconductor film may be 1:1:1, and the atomic ratio of In to Ga and Zn in the second oxide semiconductor film may be 3:1:2. Alternatively, the atomic ratio of In to Ga and Zn in the first oxide semiconductor film may be 1:3:2, and the atomic ratio of In to Ga and Zn in the second oxide semiconductor film may be 2:1:3.

At this time, one of the first oxide semiconductor film and the second oxide semiconductor film, which is closer to the gate electrode (on a channel side), preferably contains In and Ga at a proportion satisfying In>Ga. The other which is farther from the gate electrode (on a back channel side) preferably contains In and Ga at a proportion satisfying In≤Ga.

In an oxide semiconductor, the s orbital of heavy metal mainly contributes to carrier transfer, and when the In content in the oxide semiconductor is increased, overlaps of the s orbitals are likely to be increased. Thus, an oxide having a composition where In>Ga has higher mobility than an oxide having a composition where In Ga. Further, in Ga, the energy for formation of oxygen vacancy is larger and thus oxygen vacancy is less likely to occur, than in In; thus, the oxide having a composition where In≤Ga has more stable characteristics than the oxide having a composition where In>Ga.

Application of an oxide semiconductor having a composition where In>Ga on a channel side, and an oxide semiconductor having a composition where In≤Ga on a back channel side allows the mobility and reliability of the transistor to be further improved.

Further, oxide semiconductor films whose crystallinities are different from each other may be used for the first and second oxide semiconductor films. That is, the first and second oxide semiconductor films may be formed by using a combination of any of a single crystal oxide semiconductor film, a polycrystalline oxide semiconductor film, an amorphous oxide semiconductor film, and a CAAC-OS film as appropriate. When an amorphous oxide semiconductor is used for at least one of the first oxide semiconductor film and the second oxide semiconductor film, internal stress or external stress of the oxide semiconductor film 303 is relieved, variation in characteristics of a transistor is reduced, and reliability of the transistor can be further improved.

On the other hand, the amorphous oxide semiconductor film is likely to absorb an impurity which serves as a donor, such as hydrogen, and oxygen vacancies are likely to be generated, so that amorphous oxide semiconductor film is likely to be made n-type. For this reason, it is preferable to apply an oxide semiconductor having the crystallinity such as a CAAC-OS film to the oxide semiconductor film on the channel side.

Further, the oxide semiconductor film 303 is preferably subjected to heat treatment for removing excess hydrogen, including water and a hydroxyl group, (dehydration or dehydrogenation) contained in the oxide semiconductor film 303. The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor film 303 after the dehydration or dehydrogenation can be lower than or equal to $5 \times 10^{19}$ cm$^{-3}$, preferably lower than or equal to $5 \times 10^{18}$ cm$^{-3}$.

Note that the heat treatment for the dehydration or dehydrogenation may be performed at any timing in the manufacturing process of the transistor 300 as long as the heat treatment is performed after the formation of the oxide semiconductor film. The heat treatment for dehydration or dehydrogenation may be performed plural times, and may also serve as another heat treatment.

Note that in the case where an insulating layer containing oxygen is provided as the base insulating film, the heat treatment for the dehydration or dehydrogenation is preferably performed before the oxide semiconductor film is processed into an island shape because oxygen contained in the base insulating film can be prevented from being released by the heat treatment.

In the heat treatment, it is preferable that water, hydrogen, or the like be not contained in nitrogen or a rare gas such as helium, neon, or argon. For example, the purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 303 is heated by the heat treatment, a high-purity oxygen gas, a high-purity nitrous oxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the nitrous oxide gas. The purity of the oxygen gas or the nitrous oxide gas which is introduced into the heat treatment apparatus is preferably 6N or more, further preferably 7N or more (i.e., the impurity concentration in the oxygen gas or the nitrous oxide gas is preferably 1 ppm or lower, further preferably 0.1 ppm or lower). The oxygen gas or the nitrous oxide gas acts to supply oxygen that is a main component of the oxide semiconductor to compensate for a reduction of oxygen in the step for removing an impurity for the dehydration or dehydrogenation, so that the oxide semiconductor film 303 can be a highly-purified and i-type (intrinsic) oxide semiconductor film.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced to the oxide semiconductor film which has been subjected to the dehydration or dehydrogenation treatment to supply oxygen to the film.

Oxygen is added to the dehydrated or dehydrogenated oxide semiconductor film to be supplied thereto, so that the oxide semiconductor film can be highly purified and be i-type (intrinsic). Variation in electric characteristics of a transistor having the highly-purified and i-type (intrinsic) oxide semiconductor is suppressed, and the transistor is electrically stable.

In the step of addition of oxygen to the oxide semiconductor film, oxygen may be directly added to the oxide semiconductor film 303 or may be added to the oxide semiconductor film 303 through another film such as the gate insulating film 307 or the insulating film 311 to be formed later. When oxygen is introduced through another film, an ion implantation method, an ion doping method, a plasma immersion ion implantation method, or the like may be used. In the case where oxygen is directly introduced into the oxide semiconductor film 303, plasma treatment or the like can be used in addition to the above-described methods.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., an Ar gas) may be contained in the supply gas of the oxygen.

For example, in the case where an oxygen ion is introduced into the oxide semiconductor film 303 by an ion implantation method, the dose can be greater than or equal to $1 \times 10^{13}$ ions/cm$^2$ and less than or equal to $5 \times 10^{16}$ ions/cm$^2$.

Alternatively, oxygen may be supplied to the oxide semiconductor film 303 in the following manner: an insulating layer in contact with the oxide semiconductor film 303 is formed to have an oxygen excess region; and heat treatment is performed in a state where the insulating layer and the oxide semiconductor film 303 are in contact with each other, so that excess oxygen contained in the insulating layer is diffused to the oxide semiconductor film 303. This heat treatment can serve as other heat treatment in the process for manufacturing the transistor 300.

The timing of supply of oxygen to the oxide semiconductor film is not particularly limited to the above as long as it is after the formation of the oxide semiconductor film. The step of introducing oxygen into the oxide semiconductor film may be performed plural times. Further, in the case where the oxide semiconductor film has a stacked-layer structure of a plurality of layers, heat treatment for dehydration or dehydrogenation and/or oxygen supply may be performed separately on each oxide semiconductor film or may be performed once on the oxide semiconductor film 303 after the oxide semiconductor film 303 having a stacked-layer structure is formed.

In the case of forming a base insulating film, the base insulating film and the oxide semiconductor film 303 are preferably formed in succession without exposure to the air. By the successive formation of the base insulating film and the oxide semiconductor film 303 without being exposed to air, impurities such as hydrogen and moisture can be prevented from being adsorbed onto a surface of the base insulating film.

<Source Electrode and Drain Electrode>

Next, a conductive film is formed over the oxide semiconductor film 303 and is etched to form the source electrode 305a and the drain electrode 305b.

The source electrode 305a and the drain electrode 305b can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used for the source electrode 305a and the drain electrode 305b. The source electrode 305a and the drain electrode 305b may have either a single-layer structure or a stacked-layer structure.

The source electrode 305a and the drain electrode 305b can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the source electrode 305a and the drain electrode 305b have a stacked-layer structure of the above conductive material and the above metal material.

<Gate Insulating Film>

Next, the gate insulating film 307 which covers the oxide semiconductor film 303 is formed. The gate insulating film 307 can be formed to have a thickness greater than or equal to 1 nm and less than or equal to 20 nm by a sputtering method, an MBE method, a CVD method, a pulse laser deposition method, an ALD method, or the like as appropriate. Note that a high-density plasma CVD method using microwaves (e.g., with a frequency of 2.45 GHz) is preferably employed for forming the gate insulating film 307 because an insulating layer can be dense and can have high breakdown voltage and high quality.

To improve the coverage with the gate insulating film 307, the above-described planarization treatment may be performed also on the top surface of the oxide semiconductor film 303. In particular, in the case where a thin insulating layer is used as the gate insulating film 307, it is preferable that the oxide semiconductor film 303 have improved surface flatness.

The gate insulating film 307 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 307 include oxygen in a portion which is in contact with the oxide semiconductor film 303. In particular, the gate insulating film 307 preferably contains, in the film (bulk), oxygen in excess of the stoichiometric composition. For example, in the case where a silicon oxide film is used as the gate insulating film 307, the composition formula is preferably $SiO_{2+\alpha}$ ($\alpha>0$). Further, the gate insulating film 307 is preferably formed in consideration of the size of a transistor to be formed and the step coverage with the gate insulating film 307.

Further, as a material of the gate insulating film 307, hafnium oxide, yttrium oxide, hafnium silicate ($HfSi_xO_y$ ($x>0$, $y>0$)), hafnium silicate to which nitrogen is added, hafnium aluminate ($HfAl_xO_y$ ($x>0$, $y>0$)), lanthanum oxide, or the like may be used. Further, the gate insulating film 307 may have either a single-layer structure or a stacked-layer structure.

<Gate Electrode>

Next, a conductive film is formed over the gate insulating film 307 and then etched, so that the gate electrode 309 is formed.

The gate electrode 309 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode 309. The gate electrode 309 has either a single-layer structure or a stacked-layer structure. The thickness of the gate electrode 309 is preferably greater than or equal to 50 nm and less than or equal to 300 nm.

The gate electrode 309 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 309 has a stacked-layer structure of the above conductive material and the above metal material.

As one layer of the gate electrode 309 which is in contact with the gate insulating film 307, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher, preferably 5.5 eV or higher, which enables the threshold voltage of the transistor to take a positive value when used as the gate electrode, so that a switching element of what is called normally-off type can be achieved.

With the above material and manufacturing method, the transistor 300 can be manufactured.

<Insulating Film>

Next, the insulating film 311 is preferably formed over the transistor 300. The insulating film 311 functions as a barrier film of the transistor 300. As the insulating film 311, a film having lower oxygen permeability than the gate insulating film 307 can be used. A film having a high shielding effect (blocking effect) of preventing penetration of both oxygen and impurities such as hydrogen and a hydrogen compound (e.g., water) is more preferably used.

For the insulating film 311, aluminum oxide can be used, for example. In the insulating film 311, the thickness of a region in contact with the top surface of the gate insulating film 307 is preferably greater than or equal to 5 nm and less than or equal to 20 nm, further preferably greater than or equal to 5 nm and less than or equal to 10 nm. With the thickness of the region in contact with the top surface of the gate insulating film 307 being greater than or equal to 5 nm, a sufficient barrier effect can be obtained. However, in the case of making the thickness of the insulating film 311 too large, it takes a long time to deposit the insulating film 311 and etch the film for processing; accordingly, the productivity is reduced. Thus, with the thickness of the region in contact with the top surface of the gate insulating film 307 in the insulating film 311 (i.e., a region which might have the greatest thickness in the insulating film 311) being less than or equal to 20 nm, patterning can be easily performed in a later step.

<Insulating Film>

Then, the insulating film 313 is preferably formed over the insulating film 311. The insulating film 313 can be formed using a material and a formation method which are similar to those of the gate insulating film 307.

<Wiring>

After that, the wiring 315a which is electrically connected to the source electrode 305a and the wiring 315b which is electrically connected to the drain electrode 305b are formed. The wiring 315a and the wiring 315b can be formed using a material and a formation method which are similar to those of the gate electrode 309.

Note that although the wiring 315a and the wiring 315b are provided over the source electrode 305a and the drain electrode 305b in FIG. 4A, the present invention is not limited thereto. For example, the wiring 315a and the wiring 315b may be provided below the source electrode 305a and the drain electrode 305b. In such a case, the wiring 315a and the wiring 315b are formed before the source electrode 305a and the drain electrode 305b are formed.

Through the above steps, stable electrical characteristics can be given to the transistor 300, so that a highly reliable semiconductor device can be provided.

Figure 4B:
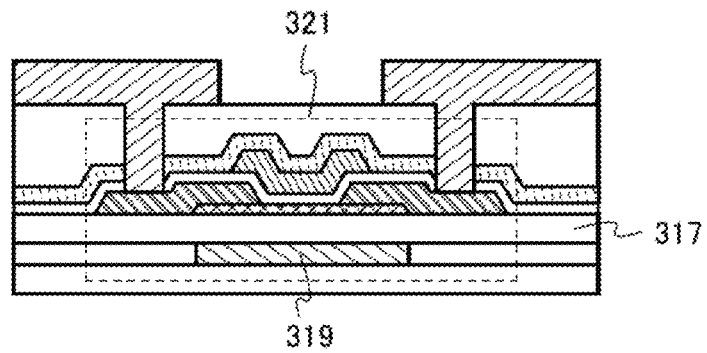
Figure 4C:
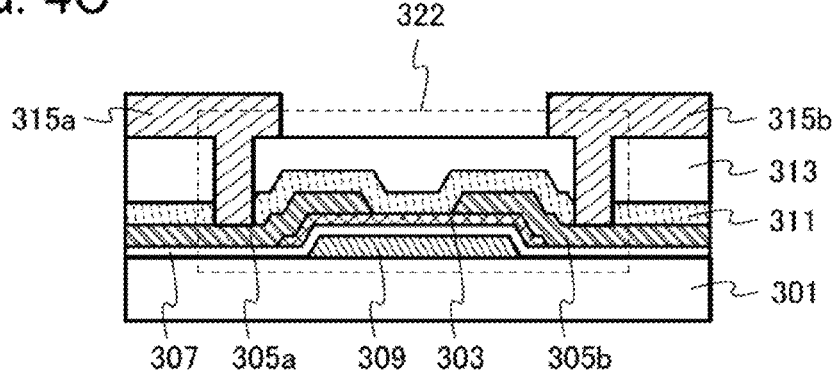
Figure 4D:
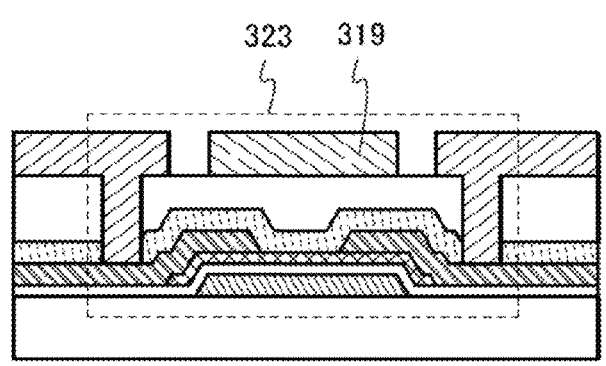

Note that any of transistors 321 to 323 illustrated in FIGS. 4B to 4D may be applied to the semiconductor device of one embodiment of the present invention. The transistors 321 to 323 can be manufactured referring to the material and manufacturing method for the transistor 300 in FIG. 4A.

The main difference between the transistor 321 in FIG. 4B and the transistor 300 in FIG. 4A is that the transistor 321 in FIG. 4B includes a conductive layer 319 which overlaps with the oxide semiconductor film 303 with an insulating film 317 provided therebetween. The conductive layer 319 can be formed using a material and a formation method which are similar to those of the gate electrode 309.

The conductive layer 319 can function as a back gate electrode. The level of a potential applied to the conductive layer 319 is controlled, whereby the threshold voltage of the transistor 300 can be controlled. For example, the conductive layer 319 can be electrically connected to the gate electrode 309, so that on-state current of the transistor 300 can be increased. Further, a potential lower than a potential of the source electrode 305a can be applied to the conductive layer 319, so that off-state current of the transistor can be reduced.

The main difference between the transistor 322 in FIG. 4C and the transistor 300 in FIG. 4A is the stacking order of the components of the transistor. Specifically, the transistor 322 in FIG. 4C includes, over the substrate 301 having an insulating surface, the gate electrode 309, the oxide semiconductor film 303 which overlaps with the gate electrode 309 with the gate insulating film 307 provided therebetween, and the source electrode 305a and the drain electrode 305b which are in contact with the oxide semiconductor film 303, in that order.

The wiring 315a which is electrically connected to the source electrode 305a and the wiring 315b which is electrically connected to the drain electrode 305b may be provided. Further, an insulating film 311 and an insulating film 313 may be provided over the transistor 322.

The main difference between the transistor 323 in FIG. 4D and the transistor 322 in FIG. 4C is that the transistor 323 in FIG. 4D includes a conductive layer 319 which overlaps with the oxide semiconductor film 303 with an insulating film provided therebetween.

The conductive layer 319 may be electrically insulated to be in a floating state, or may be in a state where a potential is supplied from another element. In the latter case, a potential with the same level as that applied to the gate electrode 309 may be applied to the conductive layer 319, or a fixed potential such as a ground potential may be applied to the conductive layer 319. The level of a potential applied to the conductive layer 319 is controlled, so that the threshold voltage of the transistor 322 can be controlled.

Embodiment 4

In this embodiment, a transistor and a resistor that can be used for the semiconductor device of one embodiment of the present invention, and a stacking example of the transistor and the resistor will be described.

First, a stacking example in the memory cell 101 in FIG. 1B will be described with reference to FIGS. 5A to 5D.

Figure 5A:
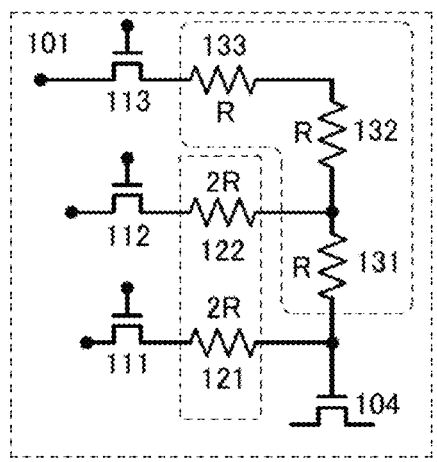
FIGS. 5A to 5D illustrate semiconductor devices of one embodiment of the present invention.

The memory cell 101 in FIG. 1B includes the R-2R ladder D/A converter 102, the amplifier transistor 104, the selection transistor 105, and the capacitor 106, and can store two-bit data. FIG. 5A selectively illustrates the transistors 111 to 113, the amplifier transistor 104, the resistor 121, the resistor 122, the resistor 131, the resistor 132, and the resistor 133 included in the memory cell 101 for easy understanding.

The resistance values of the resistor 131, the resistor 132, and the resistor 133 of the memory cell 101 in FIG. 5A are each expressed by R. Since each of the resistance values of the resistor 121 and the resistor 122 is double the resistance value of each of the resistor 131, the resistor 132, and the resistor 133, the resistance values of the resistor 121 and the resistor 122 can be each expressed by 2R.

Figure 5B:
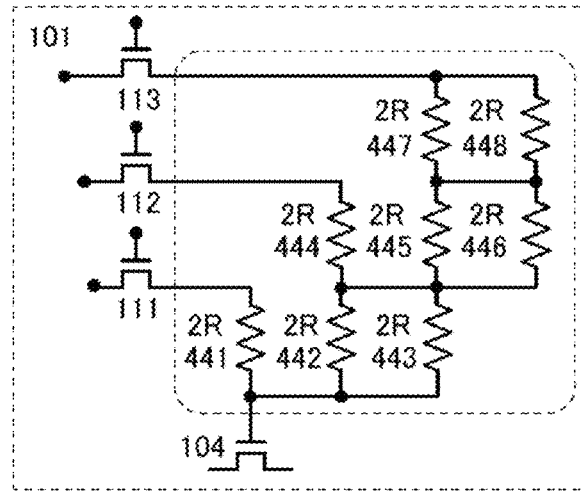

In the memory cell 101 in FIG. 5A, resistors 441 to 448 whose resistance values are 2R can be combined as in FIG. 5B.

Figure 5C:
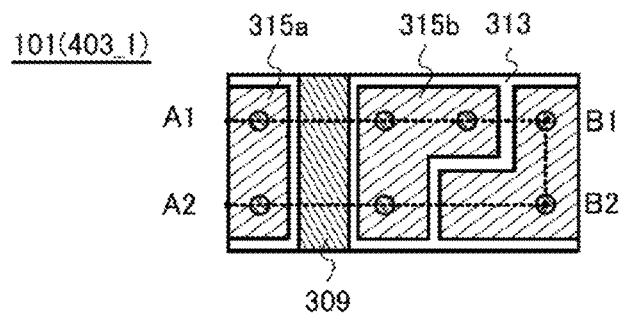
Figure 5D:
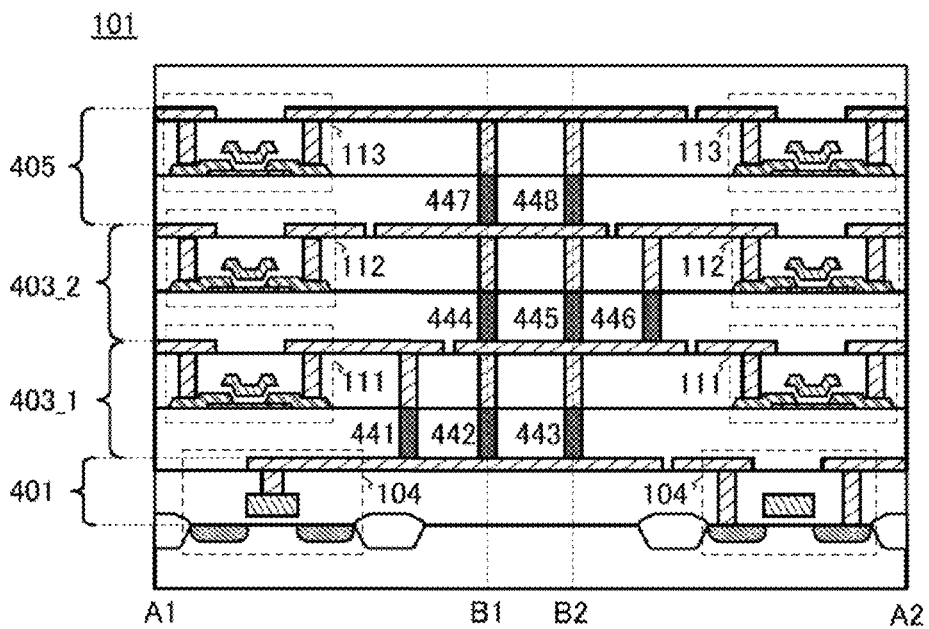

A stacking example in the memory cell 101 illustrated in FIG. 5B in which the resistors 441 to 448 whose resistance values are 2R are combined is described with reference to FIGS. 5C and 5D. FIG. 5C is a plan view of a tier 403_1 including the transistor 111, which is a typical example of a plurality of tiers included in the memory cell 101. FIG. 5D is a cross-sectional view of the memory cell 101 along lines A1-B1, B1-B2, and B2-A2 in FIG. 5C.

First, a tier 401 including the amplifier transistor 104 is preferably provided in the lowermost tier of the memory cell 101 as illustrated in FIG. 5D. In this embodiment, single crystal silicon is used for a channel formation region of the amplifier transistor 104, which enables high-speed reading. As illustrated in FIG. 5D, for example, a plurality of embedded insulating layers are provided in a single crystal silicon substrate, and the channel formation region, a source region, and a drain region of the amplifier transistor 104 are provided in a semiconductor region between the plurality of embedded insulating layers. The source region and the drain region can be formed by introduction of an impurity element using the gate electrode as a mask, for example. In that case, a region between the source region and the drain region is the channel formation region.

Then, the tier 403_1 including the transistor 111 and the resistors 441 to 443 is provided over the tier 401; a tier 403_2 including the transistor 112 and the resistors 444 to 446 is provided over the tier 403_1; and a tier 405 including the transistor 113 and the resistors 447 and 448 is provided over the tier 403_2. In this manner, the plurality of transistors included in the D/A converter are stacked alternately with interlayer films, so that the area of the memory cell can be reduced.

As the transistors 111 to 113 in the memory cell 101 in FIG. 5D, the transistor 300 illustrated in FIG. 4A in which an oxide semiconductor is used for the channel formation region is used.

As illustrated in FIG. 5D, the resistors 441 to 448 can be formed using a conductive material provided in contact holes in the interlayer films. The resistors 441 to 448 can be formed by an etching method, a damascene method, or the like. A material that can be used for the resistors 441 to 448 is selected from conductors as appropriate and can be a metal, a semiconductor, an oxide thereof, or an alloy thereof. A conductive organic substance can also be used. For example, chromium, manganese, rhodium, zirconium, tin, bismuth, tantalum, iron, lead, copper, titanium, nickel, tungsten, indium, aluminum, magnesium, zinc, silicon, germanium, and antimony, an oxide of any of these materials, an alloy thereof, and the like can be given. Further, it is preferable that 2R, the resistance value of each of the resistors 441 to 448, is sufficiently higher than the on-resistance $R_{TFT}$ of each of the transistors 111 to 113 (also referred to as the channel resistance when the transistor is turned on). For example, Formula (2) is preferably satisfied. Here, n is the number of bits.

[FORMULA 2]

$$R_{TFT} < \frac{2R}{2^{-n}} \quad (2)$$

Since the resistors 441 to 448 are formed using a conductive material provided in the contact hole in the interlayer film, the area of the resistors can be reduced. Thus, the area of the memory cell per bit can be reduced.

With a stack of three or more tiers having the same structure as the tier 403_1 or the tier 403_2, three or more bits of data can be stored.

Figure 6A:
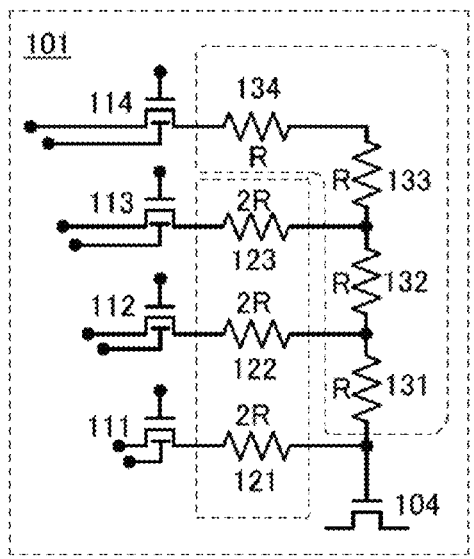
FIGS. 6A to 6C illustrate semiconductor devices of one embodiment of the present invention.
Figure 6B:
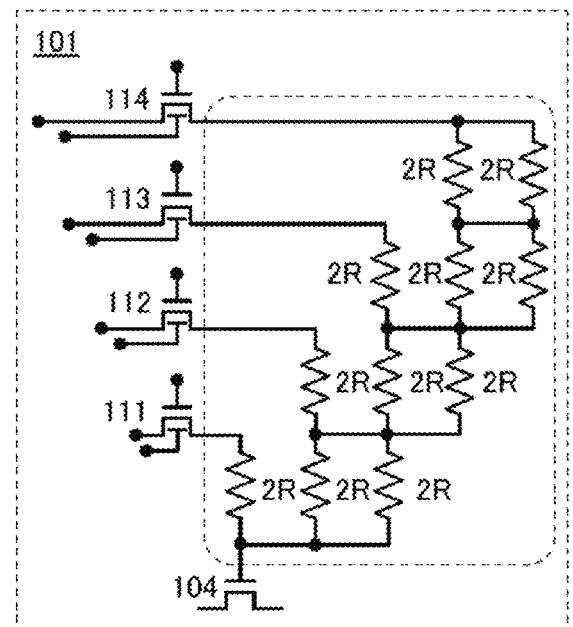
Figure 6C:
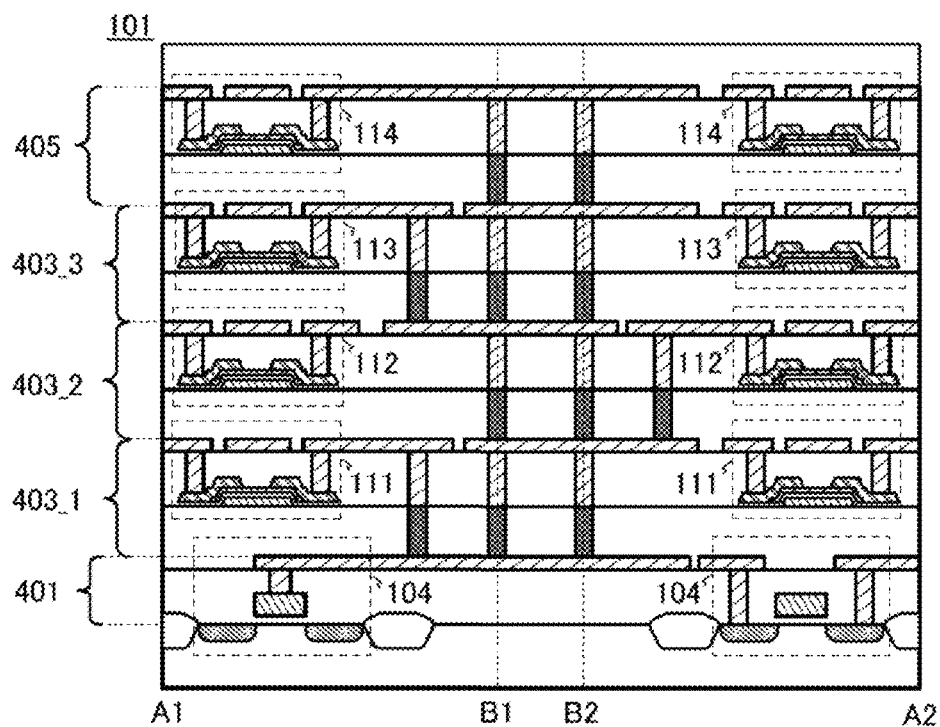

FIGS. 6A to 6C illustrate a stacking example in the memory cell 101 which can store three-bit data, for example.

FIG. 6A selectively illustrates transistors 111 to 114, the amplifier transistor 104, the resistor 121, the resistor 122, a resistor 123, the resistor 131, the resistor 132, the resistor 133, and a resistor 134 included in the memory cell 101 which can store three-bit data.

The resistance values of the resistor 131, the resistor 132, the resistor 133, and the resistor 134 of the memory cell 101 in FIG. 6A are each expressed by R. Since each of the resistance values of the resistor 121, the resistor 122, and the resistor 123 is double the resistance value of each of the resistor 131, the resistor 132, the resistor 133, and the resistor 134, the resistance values of the resistor 121, the resistor 122, and the resistor 123 can be each expressed by 2R.

In the memory cell 101 in FIG. 6A, resistors whose resistance values are 2R can be combined as in FIG. 6B.

A stacking example in the memory cell 101 illustrated in FIG. 6B in which the resistors whose resistance values are 2R are combined is illustrated in FIG. 6C. In FIG. 6C, the transistor 323 illustrated in FIG. 4D in which an oxide semiconductor is used for the channel formation region is applied to each of the transistors 111 to 114.

As illustrated in FIG. 6C, a tier 403_3 having the same structure as the tier 403_1 is provided between the tier 403_2 and the tier 405. Accordingly, the memory cell 101 which can store three-bit data can be obtained.

With such a structure, a photomask used for forming the tier 403_1 can also be used as a photomask used for forming the tier 403_3. That is, a photomask used for forming the transistor 111, the resistor 121, and the resistor 131 can also be used for forming the transistor 113, the resistor 123, and the resistor 133. Thus, cost for photomasks can be reduced, leading to a reduction in manufacturing cost of the semiconductor device. In addition, a manufacturing apparatus and the setup of the apparatus which are used for patterning, etching, or the like for forming the tier 403_1 can be used for forming the tier 403_3. As a result, the manufacturing apparatus can be effectively used and conditions can be easily set; thus, manufacturing cost of the semiconductor device can be reduced.

This embodiment can be implemented in combination with any of the other embodiments. For example, this embodiment may be applied to a read circuit, which includes a D/A converter as in the memory cell 101 described with reference to FIG. 9, FIGS. 10A and 10B, and FIG. 11.

Embodiment 5

In this embodiment, a configuration of a central processing unit (CPU) which is one of semiconductor devices of one embodiment of the present invention will be described.

Figure 7:
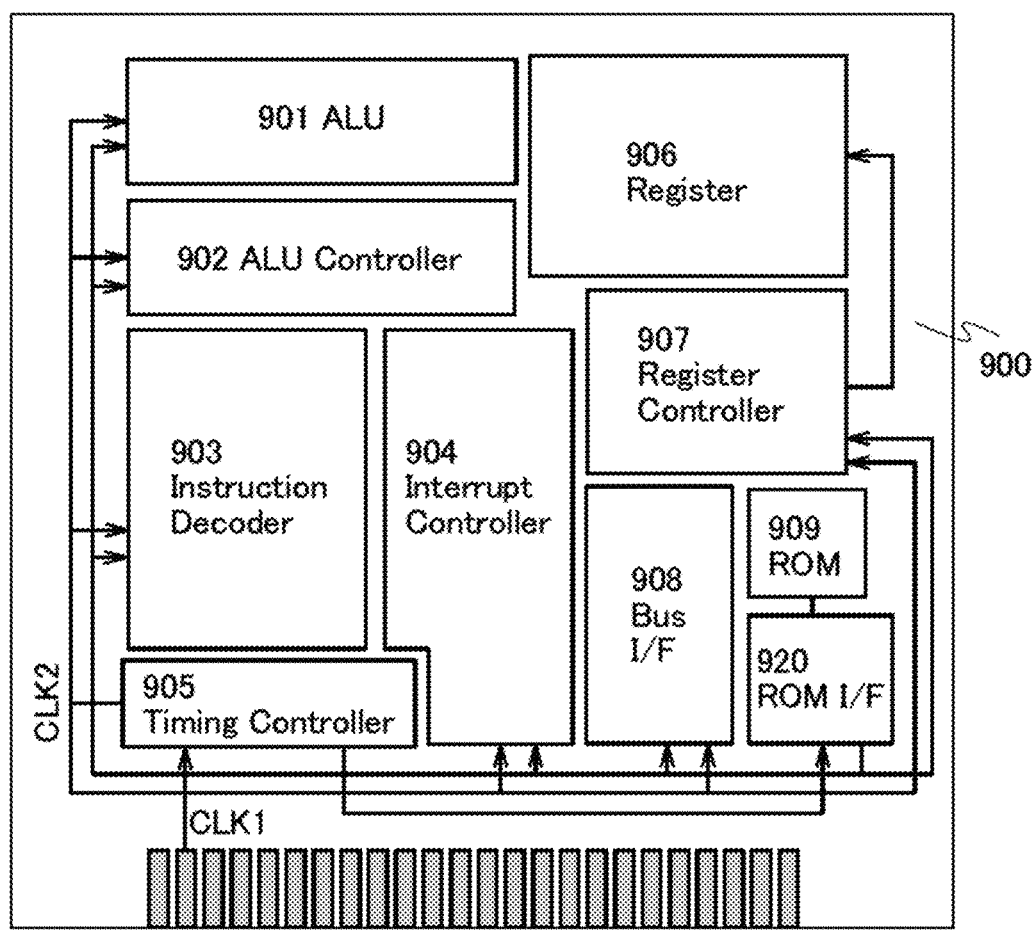
FIG. 7 illustrates a semiconductor device of one embodiment of the present invention.

FIG. 7 illustrates a configuration of the CPU of this embodiment. The CPU illustrated in FIG. 7 mainly includes an ALU 901, an ALU controller 902, an instruction decoder 903, an interrupt controller 904, a timing controller 905, a register 906, a register controller 907, a bus I/F 908, a rewritable ROM 909, and a ROM I/F 920, over a substrate 900. Note that "ALU" means "arithmetic logic unit", the "bus I/F" means "bus interface", and the "ROM I/F" means "ROM interface". Further, the ROM 909 and the ROM I/F 920 may be provided over different chips. Needless to say, the CPU illustrated in FIG. 7 is only an example having a simplified configuration, and an actual CPU may have a variety of configurations depending on the uses.

An instruction which is input to the CPU via the bus I/F 908 is input to the instruction decoder 903 and decoded therein, and then input to the ALU controller 902, the interrupt controller 904, the register controller 907, and the timing controller 905.

The ALU controller 902, the interrupt controller 904, the register controller 907, and the timing controller 905 perform a variety of controls based on the decoded instruction. Specifically, the ALU controller 902 generates signals for controlling the operation of the ALU 901. While the CPU is executing a program, the interrupt controller 904 processes an interrupt request from an external input/output device or a peripheral circuit based on its priority or a mask state. The register controller 907 generates an address of the register 906, and reads/writes data from/to the register 906 depending on the state of the CPU.

The timing controller 905 generates signals for controlling operation timing of the ALU 901, the ALU controller 902, the instruction decoder 903, the interrupt controller 904, and the register controller 907. For example, the timing controller 905 is provided with an internal clock generator for generating an internal clock signal CLK2 on the basis of a reference clock signal CLK1, and supplies the clock signal CLK2 to the above circuits.

In the CPU of this embodiment, a semiconductor device having the structure described in any of the above embodiments is provided in the register 906. Since the semiconductor device having the structure described in any of the above embodiments is a nonvolatile semiconductor device, data can be held even when the operation of the CPU is stopped and the application of power supply voltage is stopped; thus, power consumption can be reduced. Specifically, for example, while a user of a personal computer does not input data to an input device such as a keyboard, the operation of the CPU can be stopped, so that the power consumption can be reduced.

Although the CPU is described as an example in this embodiment, the signal processing circuit of one embodiment of the present invention is not limited to the CPU and can be applied to an LSI such as a microprocessor, an image processing circuit, a digital signal processor (DSP), or a field programmable gate array (FPGA).

This embodiment can be implemented in combination with any of the other embodiments.

Embodiment 6

In this embodiment, the case where the semiconductor device described in any of the above embodiments is applied to electronic devices will be described with reference to FIGS. 8A to 8F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a digital camera, a digital video camera, an electronic paper, and a television device (also referred to as a television or a television receiver).

Figure 8A:
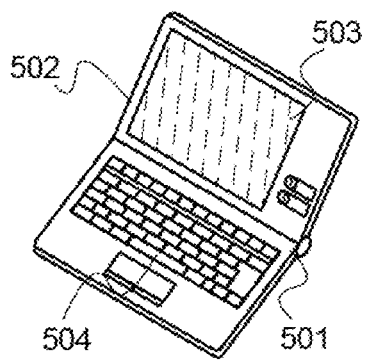
FIGS. 8A to 8F each illustrate a semiconductor device of one embodiment of the present invention.

FIG. 8A illustrates a notebook personal computer, which includes a housing 501, a housing 502, a display portion 503, a keyboard 504, and the like. The housing 501 and the housing 502 each include an electronic circuit, and the electronic circuit includes the semiconductor device described in any of the above embodiments. Thus, a notebook personal computer with sufficiently low power consumption can be fabricated at low cost.

Figure 8D:
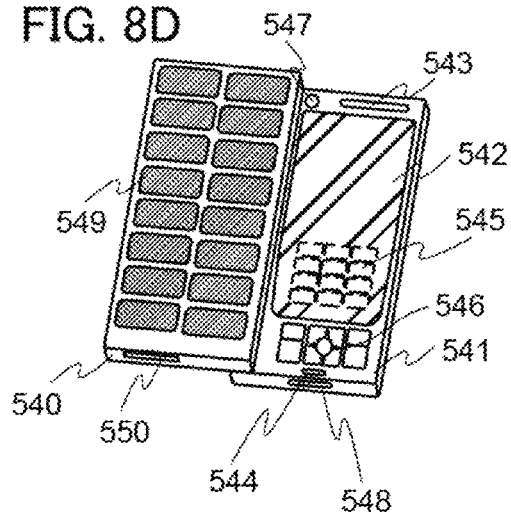
Figure 8B:
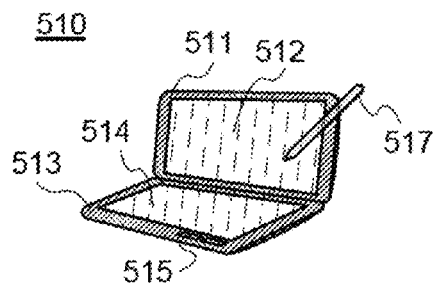

FIG. 8B illustrates a tablet terminal 510. The tablet terminal 510 includes a housing 511 including a display portion 512, a housing 513 including a display portion 514, and operation keys 515. In addition, a stylus 517 for operating the tablet terminal 510, and the like are provided. The housing 511 and the housing 513 include an electronic circuit, and the electronic circuit includes the semiconductor device described in any of the above embodiments. Thus, a tablet terminal with sufficiently low power consumption can be fabricated at low cost.

Figure 8E:
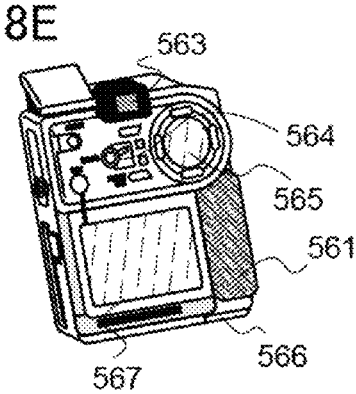
Figure 8C:
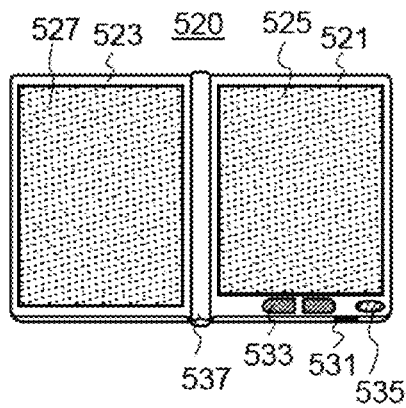

FIG. 8C illustrates an e-book reader 520 incorporating an electronic paper. The e-book reader 520 includes a housing 521 and a housing 523. The housing 521 and the housing 523 are provided with a display portion 525 and a display portion 527, respectively. The housing 521 and the housing 523 are connected by a hinge portion 537 and can be opened or closed with the hinge portion 537. The housing 521 is provided with a power supply 531, an operation key 533, a speaker 535, and the like. At least one of the housing 521 and the housing 523 is provided with the semiconductor device described in any of the above embodiments. Thus, an e-book reader with sufficiently low power consumption can be fabricated at low cost.

FIG. 8D illustrates a mobile phone, which includes a housing 540 and a housing 541. Moreover, the housing 540 and the housing 541 in a state where they are developed as illustrated in FIG. 8D can be slid so that one is lapped over the other. Thus, the size of the mobile phone can be reduced, which makes the mobile phone suitable for being carried around. The housing 541 includes a display panel 542, a speaker 543, a microphone 544, an operation key 545, a pointing device 546, a camera 547, an external connection terminal 548, and the like. The housing 540 includes a solar cell 549 for charging the cellular phone, an external memory slot 550, and the like. In addition, an antenna is incorporated in the housing 541. At least one of the housing 540 and the housing 541 includes an electronic circuit, and the electronic circuit includes the semiconductor device described in any of the above embodiments. Thus, a mobile phone with sufficiently low power consumption can be fabricated at low cost.

FIG. 8E illustrates a digital camera, which includes a main body 561, a display portion 567, an eyepiece 563, an operation switch 564, a display portion 565, a battery 566, and the like. The main body 561 includes an electronic circuit, and the electronic circuit includes the semiconductor device described in any of the above embodiments. Thus, a digital camera with sufficiently low power consumption can be fabricated at low cost.

Figure 8F:
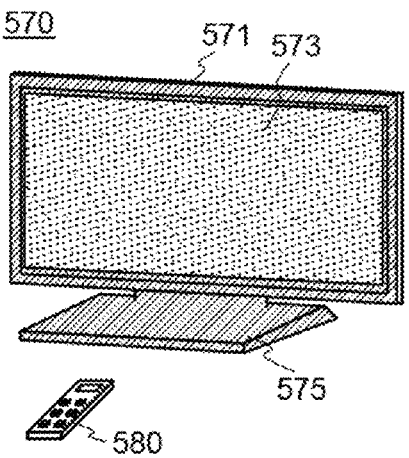

FIG. 8F illustrates a television device 570, which includes a housing 571, a display portion 573, a stand 575, and the like. Operation of the television device 570 can be performed by a switch provided in the housing 571 or a remote controller 580. The housing 571 and the remote controller 580 each includes an electronic circuit, and the electronic circuit includes the semiconductor device described in any of the above embodiments. Thus, a television device with sufficiently low power consumption can be fabricated at low cost.

As described above, the semiconductor device described in any of the above embodiments is provided for each of the electronic devices described in this embodiment. Thus, an electronic device with sufficiently low power consumption can be fabricated at low cost.

This application is based on Japanese Patent Application serial no. 2012-076671 filed with Japan Patent Office on Mar. 29, 2012 and Japanese Patent Application serial no. 2012-098813 filed with Japan Patent Office on Apr. 24, 2012, the entire contents of which are hereby incorporated by reference.

What is claimed is:

1. A semiconductor device comprising:
   a first memory cell comprising:
      a first transistor;
      a second transistor over the first transistor;
      a third transistor over the second transistor;
      a first resistor;
      a second resistor; and
      a third resistor, wherein one of a source and a drain of the second transistor is electrically connected to a gate of the first transistor through the first resistor, and wherein one of a source and a drain of the third transistor is electrically connected to the gate of the first transistor through the second resistor and the third resistor.

2. The semiconductor device according to claim 1, wherein a resistance of the first resistor is the same as a resistance of the second resistor and twice a resistance of the third resistor.

3. The semiconductor device according to claim 1,
wherein the first memory cell comprises a fourth transistor over the third transistor,
wherein the first memory cell comprises a fourth resistor, and a fifth resistor, and
wherein one of a source and a drain of the fourth transistor is electrically connected to the gate of the first transistor through the fourth resistor, the fifth resistor, and the third resistor.

4. The semiconductor device according to claim 3, wherein a resistance of the first resistor is the same as a resistance of the second resistor and twice a resistance of the third resistor, a resistance of the fourth resistor, and a resistance of the fifth resistor.

5. The semiconductor device according to claim 3, wherein a resistance of the first resistor is the same as a resistance of the second resistor and a resistance of the fourth resistor and twice a resistance of the third resistor and a resistance of the fifth resistor.

6. The semiconductor device according to claim 3, wherein at least one of the second transistor, the third transistor, and the fourth transistor comprises a channel formation region comprising an oxide semiconductor.

7. The semiconductor device according to claim 1, further comprising:
a second memory cell;
a third memory cell;
a first write selection line electrically connected to the first memory cell and the second memory cell;
a second write selection line electrically connected to the third memory cell;
a first write data line electrically connected to the first memory cell and the third memory cell;
a second write data line electrically connected to the first memory cell and the third memory cell;
a third write data line electrically connected to the second memory cell;
a fourth write data line electrically connected to the second memory cell;
a first read data line electrically connected to the first memory cell and the third memory cell; and
a second read data line electrically connected to the second memory cell,
wherein each of the second memory cell and the third memory cell comprises a first transistor, a second transistor, and a third transistor,
wherein one of a source and a drain of the second transistor of each of the second memory cell and the third memory cell is electrically connected to a gate of the first transistor of each the second memory cell and the third memory cell, and
wherein one of a source and a drain of the third transistor of each of the second memory cell and the third memory cell is electrically connected to the gate of the first transistor of each of the second memory cell and the third memory cell.

8. The semiconductor device according to claim 7,
wherein one of a source and a drain of the first transistor of each of the first memory cell and the third memory cell is electrically connected to the first read data line,
wherein one of a source and a drain of the first transistor of the second memory cell is electrically connected to the second read data line,
wherein the other of the source and the drain of the second transistor of each of the first memory cell and the third memory cell is electrically connected to the first write data line,
wherein the other of the source and the drain of the third transistor of each of the first memory cell and the third memory cell is electrically connected to the second write data line,
wherein the other of the source and the drain of the second transistor of the second memory cell is electrically connected to the third write data line,
wherein the other of the source and the drain of the third transistor of the second memory cell is electrically connected to the fourth write data line,
wherein a gate of the second transistor of each of the first memory cell and the second memory cell is electrically connected to the first write selection line,
wherein a gate of the third transistor of each of the first memory cell and the second memory cell is electrically connected to the first write selection line,
wherein a gate of the second transistor of the third memory cell is electrically connected to the second write selection line, and
wherein a gate of the third transistor of the third memory cell is electrically connected to the second write selection line.

9. The semiconductor device according to claim 8,
wherein each of the first memory cell, the second memory cell, and the third memory cell comprises a first resistor, a second resistor, and a third resistor,
wherein the one of the source and the drain of the second transistor of each of the first memory cell, the second memory cell, and the third memory cell is electrically connected to the gate of the first transistor of each of the first memory cell, the second memory cell, and the third memory cell through the first resistor of each of the first memory cell, the second memory cell, and the third memory cell, and
wherein the one of the source and the drain of the third transistor of each of the first memory cell, the second memory cell, and the third memory cell is electrically connected to the gate of the first transistor of each of the first memory cell, the second memory cell, and the third memory cell through the second resistor and the third resistor of each of the first memory cell, the second memory cell, and the third memory cell.

10. The semiconductor device according to claim 9, wherein a resistance of the first resistor of each of the first memory cell, the second memory cell, and the third memory cell is the same as a resistance of the second resistor of each of the first memory cell, the second memory cell, and the third memory cell and twice a resistance of the third resistor of each of the first memory cell, the second memory cell, and the third memory cell.

11. The semiconductor device according to claim 9,
wherein each of the first memory cell, the second memory cell, and the third memory cell comprises a fourth transistor, a fourth resistor, and a fifth resistor, and
wherein one of a source and a drain of the fourth transistor of each of the first memory cell, the second memory cell, and the third memory cell is electrically connected to the gate of the first transistor of each of the first memory cell, the second memory cell, and the third memory cell through the fourth resistor, the fifth resistor, and the third resistor of each of the first memory cell, the second memory cell, and the third memory cell.

12. The semiconductor device according to claim 11, wherein a resistance of the first resistor of each of the first memory cell, the second memory cell, and the third memory cell is the same as a resistance of the second resistor of each of the first memory cell, the second memory cell, and the third memory cell and twice a resistance of the third resistor of each of the first memory cell, the second memory cell, and the third memory cell, a resistance of the fourth resistor of each of the first memory cell, the second memory cell, and the third memory cell, and a resistance of the fifth resistor of each of the first memory cell, the second memory cell, and the third memory cell.

13. The semiconductor device according to claim 11, wherein a resistance of the first resistor of each of the first memory cell, the second memory cell, and the third memory cell is the same as a resistance of the second resistor of each of the first memory cell, the second memory cell, and the third memory cell and a resistance of the fourth resistor of each of the first memory cell, the second memory cell, and the third memory cell and twice a resistance of the third resistor of each of the first memory cell, the second memory cell, and the third memory cell and a resistance of the fifth resistor of each of the first memory cell, the second memory cell, and the third memory cell.

14. The semiconductor device according to claim 11, wherein at least one of the second transistor, the third transistor, and the fourth transistor of each of the first memory cell, the second memory cell, and the third memory cell comprises a channel formation region comprising an oxide semiconductor.

15. The semiconductor device according to claim 1,
wherein the first transistor and the second transistor are stacked with a first insulating layer therebetween,
wherein the second transistor and the third transistor are stacked with a second insulating layer therebetween,
wherein the one of the source and the drain of the second transistor is electrically connected to the gate of the first transistor through a first conductor in a first contact hole in the first insulating layer, and
wherein the one of the source and the drain of the third transistor is electrically connected to the gate of the first transistor through a second conductor in a second contact hole in the first insulating layer, a third conductor in a third contact hole in the first insulating layer, and a fourth conductor in a fourth contact hole in the second insulating layer.

16. The semiconductor device according to claim 15, wherein a resistance of the first conductor is the same as a resistance of each of the second conductor, the third conductor, and the fourth conductor.

17. The semiconductor device according to claim 15,
wherein the first memory cell comprises a fourth transistor over the third transistor,
wherein the third transistor and the fourth transistor are stacked with a third insulating layer therebetween, and
wherein one of a source and a drain of the fourth transistor is electrically connected to the gate of the first transistor through the second conductor, the third conductor, a fifth conductor in a fifth contact hole in the second insulating layer, a sixth conductor in a sixth contact hole in the second insulating layer, and a seventh conductor in a seventh contact hole in the third insulating layer.

18. The semiconductor device according to claim 17, wherein a resistance of the first conductor is the same as a resistance of each of the second conductor, the third conductor, the fourth conductor, the fifth conductor, the sixth conductor, and the seventh conductor.

19. The semiconductor device according to claim 17, wherein at least one of the second transistor, the third transistor, and the fourth transistor comprises a channel formation region comprising an oxide semiconductor.

* * * * *